(12) United States Patent
Karda et al.

(10) Patent No.: US 10,607,988 B2
(45) Date of Patent: *Mar. 31, 2020

(54) APPARATUSES HAVING MEMORY CELLS WITH TWO TRANSISTORS AND ONE CAPACITOR, AND HAVING BODY REGIONS OF THE TRANSISTORS COUPLED WITH REFERENCE VOLTAGES

(71) Applicant: Micron Technology, Inc., Boise, ID (US)

(72) Inventors: Kamal M. Karda, Boise, ID (US); Chandra Mouli, Boise, ID (US); Srinivas Pulugurtha, Boise, ID (US); Rajesh N. Gupta, Karnataka (IN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/398,501

(22) Filed: Apr. 30, 2019

(65) Prior Publication Data
US 2019/0259769 A1 Aug. 22, 2019

Related U.S. Application Data

(63) Continuation of application No. 16/043,653, filed on Jul. 24, 2018, now Pat. No. 10,381,357.
(Continued)

(51) Int. Cl.
*H01L 27/112* (2006.01)
*H01L 27/07* (2006.01)
(Continued)

(52) U.S. Cl.
CPC ........ *H01L 27/0733* (2013.01); *G11C 11/408* (2013.01); *G11C 11/4074* (2013.01);
(Continued)

(58) Field of Classification Search
CPC ..... H01L 21/823431; H01L 21/823487; H01L 21/823821; H01L 21/823885;
(Continued)

(56) References Cited

U.S. PATENT DOCUMENTS 5,299,155 A * 3/1994 Yanagi ................. H01L 27/108
257/306
5,571,730 A * 11/1996 Park .................. H01L 27/10823
438/269

(Continued)

FOREIGN PATENT DOCUMENTS

JP 05-041502 A 2/1993
WO WO 11/2018
PCT/US2018/043313

*Primary Examiner* — Eduardo A Rodela
(74) *Attorney, Agent, or Firm* — Wells St. John, P.S.

(57) ABSTRACT

Some embodiments include a memory cell with two transistors and one capacitor. The transistors are a first transistor and a second transistor. The capacitor has a first node coupled with a source/drain region of the first transistor, and has a second node coupled with a source/drain region of the second transistor. The memory cell has a first body region adjacent the source/drain region of the first transistor, and has a second body region adjacent the source/drain region of the second transistor. A first body connection line couples the first body region of the memory cell to a first reference voltage. A second body connection line couples the second body region of the memory cell to a second reference voltage. The first and second reference voltages may be the same as one another, or may be different from one another.

19 Claims, 16 Drawing Sheets

US 10,607,988 B2
Page 2

Related U.S. Application Data

(60) Provisional application No. 62/552,995, filed on Aug. 31, 2017.

(51) Int. Cl.

| | | |
|---|---|---|
| *H01L 27/108* | (2006.01) | |
| *H01L 49/02* | (2006.01) | |
| *G11C 11/4074* | (2006.01) | |
| *H01L 29/08* | (2006.01) | |
| *H01L 27/11556* | (2017.01) | |
| *H01L 21/8234* | (2006.01) | |
| *H01L 21/84* | (2006.01) | |
| *H01L 21/8238* | (2006.01) | |
| *H01L 27/11582* | (2017.01) | |
| *G11C 11/408* | (2006.01) | |
| *H01L 27/11553* | (2017.01) | |
| *H01L 29/92* | (2006.01) | |
| *G11C 5/14* | (2006.01) | |
| *G11C 5/06* | (2006.01) | |

(52) U.S. Cl.
CPC .. *G11C 11/4085* (2013.01); *H01L 21/823431* (2013.01); *H01L 21/823487* (2013.01); *H01L 21/823821* (2013.01); *H01L 21/823885* (2013.01); *H01L 21/845* (2013.01); *H01L 27/0727* (2013.01); *H01L 27/10814* (2013.01); *H01L 27/10841* (2013.01); *H01L 27/10864* (2013.01); *H01L 27/10873* (2013.01); *H01L 27/10897* (2013.01); *H01L 27/1128* (2013.01); *H01L 27/11273* (2013.01); *H01L 27/11553* (2013.01); *H01L 27/11556* (2013.01); *H01L 27/11582* (2013.01); *H01L 28/40* (2013.01); *H01L 28/90* (2013.01); *H01L 29/0847* (2013.01); *H01L 29/92* (2013.01); *G11C 5/063* (2013.01); *G11C 5/147* (2013.01)

(58) Field of Classification Search
CPC ............ H01L 21/845; H01L 27/10841; H01L 27/10864; H01L 27/11273; H01L 27/1128; H01L 27/11553; H01L 27/11556; H01L 27/11582; H01L 27/0629; H01L 27/0727; H01L 27/0733; H01L 28/40; H01L 29/92
See application file for complete search history.

(56) References Cited

U.S. PATENT DOCUMENTS

| | | | |
|---|---|---|---|
| 7,378,702 B2 * | 5/2008 | Lee | H01L 21/2007 257/295 |
| 8,878,271 B2 | 11/2014 | Karda et al. | |
| 10,115,438 B2 * | 10/2018 | Ingalls | G11C 7/062 |
| 10,153,281 B2 * | 12/2018 | Derner | H01L 27/07 |
| 2010/0200913 A1 * | 8/2010 | Masuoka | H01L 21/84 257/329 |
| 2010/0213525 A1 * | 8/2010 | Masuoka | H01L 21/823828 257/306 |
| 2010/0314676 A1 | 12/2010 | Akiyama et al. | |
| 2011/0002159 A1 | 1/2011 | Suzuki et al. | |
| 2012/0039104 A1 * | 2/2012 | Lin | H01L 21/823487 365/63 |
| 2013/0221356 A1 * | 8/2013 | Yamazaki | H01L 27/04 257/57 |
| 2014/0035018 A1 | 2/2014 | Lee | |
| 2014/0097481 A1 * | 4/2014 | La Rosa | H01L 29/788 257/315 |
| 2014/0131810 A1 * | 5/2014 | Masuoka | H01L 21/823487 257/369 |
| 2015/0054063 A1 | 2/2015 | Karda et al. | |
| 2018/0061835 A1 * | 3/2018 | Yang | H01L 29/42376 |
| 2018/0174647 A1 | 6/2018 | Takahashi et al. | |

* cited by examiner

APPARATUSES HAVING MEMORY CELLS WITH TWO TRANSISTORS AND ONE CAPACITOR, AND HAVING BODY REGIONS OF THE TRANSISTORS COUPLED WITH REFERENCE VOLTAGES

RELATED PATENT DATA

This patent resulted from a continuation of U.S. patent application Ser. No. 16/043,653, which was filed Jul. 24, 2018, and which is hereby incorporated herein by reference; and which claims priority to U.S. Provisional Application Ser. No. 62/552,995, which was filed Aug. 31, 2017.

TECHNICAL FIELD

Apparatuses having memory cells with two transistors and one capacitor, and having body regions of the transistors coupled with reference voltages.

BACKGROUND

Dynamic Random Access Memory (DRAM) is utilized in modern computing architectures. DRAM may provide advantages of structural simplicity, low cost and high speed in comparison to alternative types of memory.

A memory cell having promise for utilization in DRAM is a memory cell configuration having two transistors and one capacitor (a so-called 2T-1C memory cell configuration). A 2T-1C memory cell is schematically illustrated in FIG. 1 as a memory cell configuration 2. The two transistors of the memory cell are labeled as T1 and T2, and the capacitor of the memory cell is labeled as CAP.

A source/drain region of T1 connects with a first node of the capacitor CAP, and the other source/drain region of T1 connects with a first comparative bitline BL-1. A gate of T1 connects with a wordline WL. A source/drain region of T2 connects with a second node of the capacitor CAP, and the other source/drain region of T2 connects with a second comparative bitline BL-2. A gate of T2 connects with the wordline WL.

The comparative bitlines BL-1 and BL-2 extend to circuitry 4 which compares electrical properties (e.g., voltage) of the two to ascertain a memory state of the memory cell. The circuitry 4 may include a sense amplifier. The comparative bitlines BL-1 and BL-2 are utilized in tandem to address memory cells, and in some aspects may be considered to function together as a single digit line.

A problem that may occur relative to the transistors of the memory cell configuration 2 is described with reference to FIG. 2. The transistor T1 is illustrated together with regions of the wordline WL, the bitline BL-1 and the capacitor CAP, with only a portion of one of the electrical nodes of the capacitor being shown. The transistor T1 includes a vertical pillar 5 of semiconductor material. An insulative material 3 is provided alongside the vertical pillar 5, and over the wordline WL. Regions of the insulative material 3 between the wordline WL and the vertical pillar 5 may correspond to gate dielectric, and may have a different composition than other regions of the insulative material 3.

The insulative material 3 may comprise any suitable composition; including, for example, silicon dioxide.

The vertical pillar 5 may comprise any suitable composition, and in some embodiments may comprise appropriately-doped silicon. The vertical pillar 5 includes a body region 10 of the transistor T1, and includes source/drain regions 14 and 16 of the transistor 10.

The body region 10 is shown to be vertically offset from the source/drain regions 14 and 16, and is between the source/drain regions 14 and 16. An approximate interface between the source/drain region 14 and the body region 10 is illustrated with a dashed line 13, and an approximate interface between the source/drain region 16 and the body region 10 is illustrated with a dashed line 15. The source/drain regions 14 and 16 may be conductively-doped regions of the semiconductor material of vertical pillar 5.

The bitline BL-1 is supported by an insulative material 7. Such insulative material may comprise any suitable composition or combination of compositions; such as, for example, silicon dioxide, silicon nitride, etc.

The transistor T1 is illustrated in two operational modes A and B. The operational mode A has electrical isolation between the capacitor CAP and the bitline BL-1, and the operational mode B has electrical coupling between the capacitor CAP and the bitline BL-1. The operational mode A may correspond to an operational state of the wordline WL in which low voltage, or no voltage, is passed along the wordline. The operational mode B may correspond to an operational state of the wordline WL in which sufficient voltage is passed along the wordline to attract charge carriers to segments of the body region 10 proximate the wordline, and to thereby form conductive channels 12 (illustrated by dashed-lines) along the body region 10 between the source/drain regions 14 and 16. As the source/drain regions 14 and 16 are conductive regions coupled with the bitline BL-1 and the capacitor CAP, respectively, the conductive channels 12 electrically couple the capacitor CAP and the bitline BL-1 with one another.

A problem that may occur relative to the illustrated transistor T1 is that the body region 10 is a floating body. Consequently, a memory cell comprising such transistor (i.e., the memory cell 2) may suffer from floating body effects, which may lead to degraded charge retention, power distribution problems, and/or other problems.

Although not illustrated, the transistor T2 (shown in FIG. 1) may comprise a floating body analogous to the floating body 10 of transistor T1; which may exacerbate the floating body effects of memory cell 2.

It would be desirable to develop memory cell configurations which alleviate the above-discussed floating body effects associated with the transistors T1 and T2, and to develop memory arrays incorporating such memory cell configurations.

BRIEF DESCRIPTION OF THE DRAWINGS

FIG. 5 shows an alternative configuration relative to that of FIG. 4. The views of FIGS. 4 and 5 are along the line 4/5-4/5 of FIG. 3, and the view of FIG. 3 is along the lines 3-3 of FIGS. 4 and 5.

FIG. 6 shows an alternative configuration relative to that of FIG. 7.

FIG. 10 shows an alternative configuration relative to that of FIG. 9. The views of FIGS. 9 and 10 are along the line 9/10-9/10 of FIG. 8, and the view of FIG. 8 is along the lines 8-8 of FIGS. 9 and 10.

FIG. 11 shows an alternative configuration relative to that of FIG. 12.

FIG. 15 shows an alternative configuration relative to that of FIG. 14. The views of FIGS. 14 and 15 are along the line 14/15-14/15 of FIG. 13, and the view of FIG. 13 is along the lines 13-13 of FIGS. 14 and 15.

DETAILED DESCRIPTION OF THE ILLUSTRATED EMBODIMENTS

Some embodiments include 2T-1C memory cell configurations in which the body regions of the transistors are coupled with reference voltages instead of being left to electrically float as occurs in the conventional configurations described above in the BACKGROUND section. All of the body regions of the transistors of a memory array may be coupled with the same reference voltage; or alternatively, one or more of the body regions of the transistors of the memory array may be coupled with a different reference voltage than others of the body regions. Conductive pathways (i.e., body connection lines) may be provided to extend from the body regions to conductive components having desired reference voltages. Any suitable reference voltage(s) may be utilized, and in some embodiments the reference voltage(s) may include ground voltage and/or common plate voltage. Example embodiments are described with reference to FIGS. 3-16.

Figure 3:
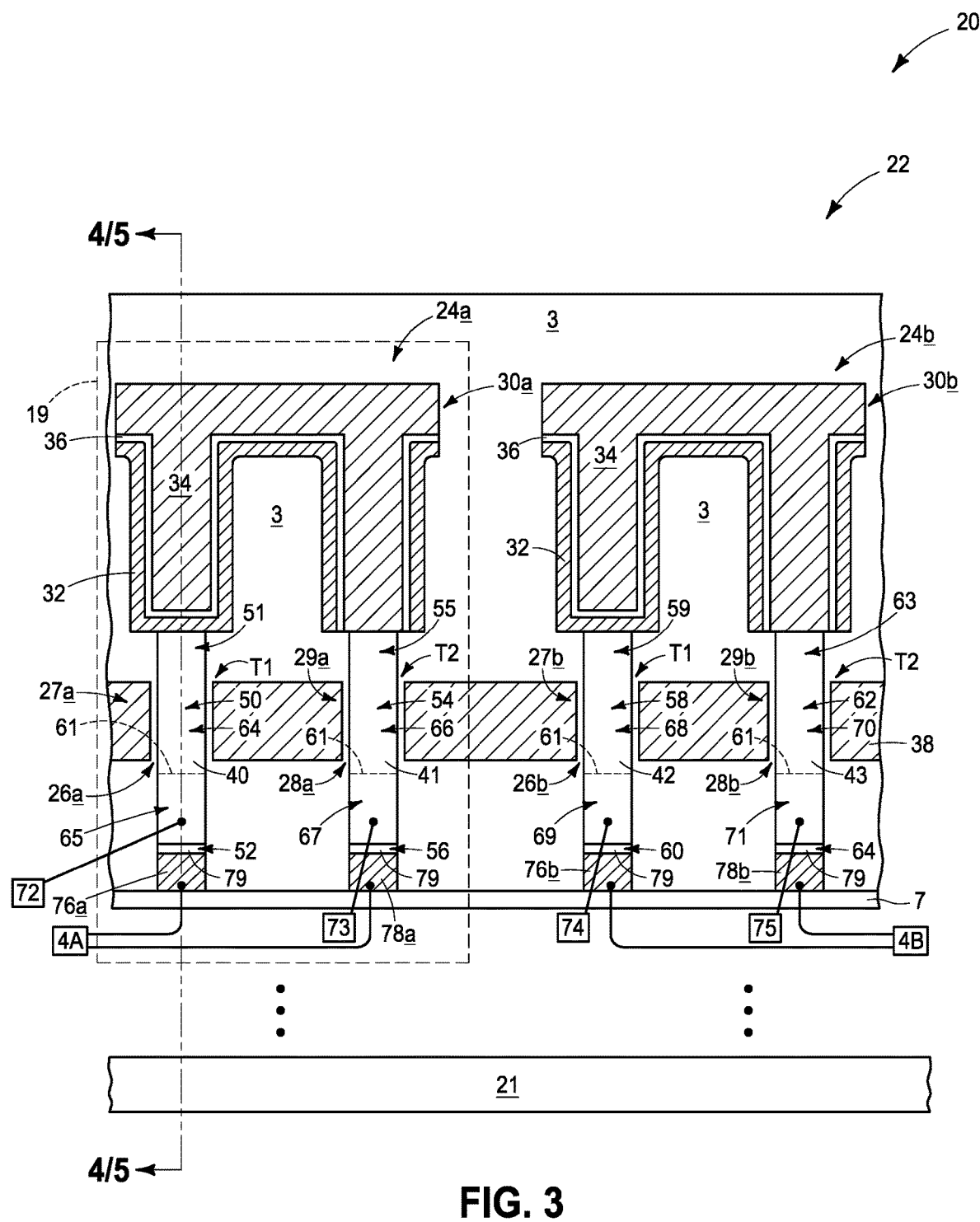
FIG. 3 is a diagrammatic cross-sectional side view of a region of an example memory array.

Referring to FIG. 3, an apparatus 20 comprises a region of a memory array 22. The memory array includes a plurality of memory cells 24, with two of the memory cells being illustrated as 24a and 24b. A dashed line 19 is provided to diagrammatically illustrate an approximate boundary of the memory cell 24a.

The memory cells 24a and 24b are supported by a base 21. The base 21 may comprise semiconductor material; and may, for example, comprise, consist essentially of, or consist of monocrystalline silicon. The base 21 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 21 may correspond to a semiconductor substrate containing one or more materials associated with integrated circuit fabrication. Such materials may include, for example, one or more of refractory metal materials, barrier materials, diffusion materials, insulator materials, etc. A gap is provided between an upper region of base 21 and a lower region of the illustrated portion of memory array 22 to indicate that there may be additional components, structures, etc., provided between the base 21 and the illustrated portion of the memory array 22. In other embodiments, the illustrated portion of the memory array 22 may be directly against an upper surface of the base 21.

Each memory cell (24a and 24b) includes two transistors; with the transistors of memory cell 24a being labeled as transistors 26a and 28a, and the transistors of memory cell 24b being labeled as 26b and 28b. The transistors 26a and 26b correspond to the first transistors T1 of the memory cells 24a and 24b, respectively; and the transistors 28a and 28b correspond to the second transistors T2 of the memory cells 24a and 24b, respectively. In some embodiments, the transistors 26a, 28a, 26b and 28b may be referred to as first, second, third and fourth transistors, respectively.

The transistors 26a, 26b, 28a and 28b include regions within semiconductor pillars 40-43, and within spacing regions 79 beneath the pillars 40-43. Specifically, the transistor 26a includes a channel region 50 within the semiconductor pillar 40; with such channel region being between a pair of source/drain regions 51 and 52. The source/drain region 51 is within the pillar 40, and the source/drain region 52 is within the spacing region 79 beneath the pillar 40. The transistor 28a includes a channel region 54 within the semiconductor pillar 41, with such channel region being between a pair of source/drain regions 55 and 56. The transistor 26b includes a channel region 58 within the semiconductor pillar 42, with such channel region being between a pair of source/drain regions 59 and 60. The transistor 28b includes a channel region 62 within the semiconductor pillar 43, with such channel region being between a pair of source/drain regions 63 and 64. In some embodiments, the source/drain regions 51, 52, 55, 56, 59, 60, 63 and 64 may be referred to as first, second, third, fourth, fifth, sixth, seventh and eighth source/drain regions respectively.

The semiconductor pillars 40-43, and the spacing regions 79 beneath the pillars, may comprise any suitable semiconductor material or combination of semiconductor materials; and in some embodiments may comprise, consist essentially of, or consist of one or both of silicon and germanium. The channel regions 50, 54, 58 and 62 within the semiconductor pillars 40-43, and the source/drain regions 51, 52, 55, 56, 59, 60, 63 and 64 may comprise appropriately-doped regions. For instance, the source/drain regions may comprise heavily-doped regions within the pillars and spacing regions 79, and the channel regions may comprise threshold-voltage-doped regions within the pillars. Boundaries between the source/drain regions and channel regions within pillars 41-43 are not illustrated in FIG. 3, and may be provided in any suitable locations.

Figure 2:
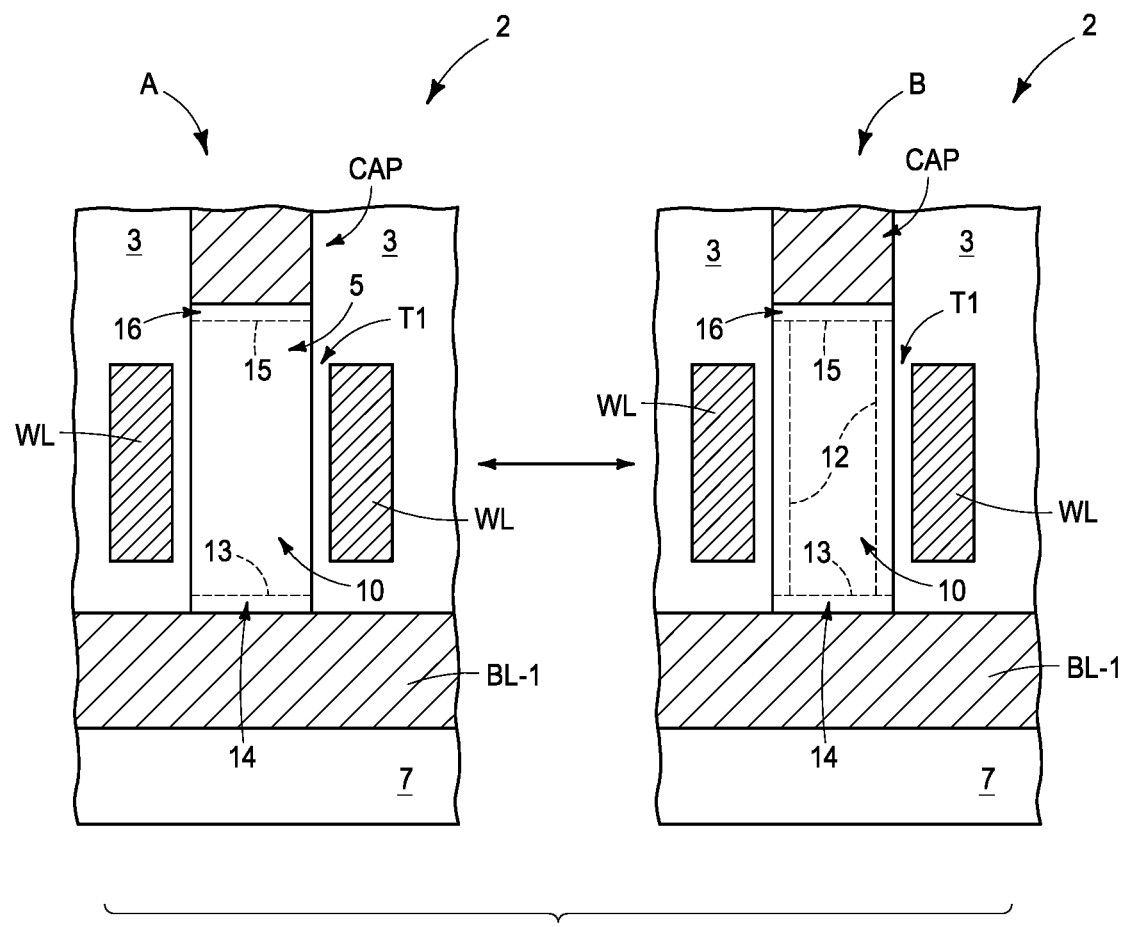
FIG. 2 shows diagrammatic cross-sectional side views of a region of a prior art transistor in two operational modes.

The transistors 26a, 28a, 26b and 28b include body regions 64, 66, 68 and 70, respectively; with such body regions being analogous to the body region 10 described above with reference to FIG. 2 (i.e., vertically between the source/drain regions of each of the transistors). However, in contrast to the prior art construction of FIG. 2, the body regions 64, 66, 68 and 70 of the transistors 26a, 28a, 26b and 28b are not electrically floating, but instead are connected to a reference voltage through body connection lines (or structures) 65, 67, 69 and 71, respectively. The body connection lines extend in and out of the page relative to the cross-sectional view of FIG. 3. Approximate upper boundaries of the body connection lines are diagrammatically illustrated with dashed lines 61. Approximate lower boundaries of the body connection lines may be considered to be along interfaces with the spacing regions 79.

The body connection lines 65, 67, 69 and 71 may be referred to as first, second, third and fourth body connection lines (or structures), respectively. The first body connection line 65 couples the first body region 64 of the first memory cell 24*a* to a first reference voltage 72. The second body connection line 67 couples the second body region 66 of the first memory cell 24*a* to a second reference voltage 73. The third body connection line 69 couples the third body region 68 of the second memory cell 24*b* to a third reference voltage 74. The fourth body connection line 71 couples the fourth body region 70 of the second memory cell 24*b* to a fourth reference voltage 75.

In some embodiments, the reference voltages 72-75 may all be a common reference voltage. Such common reference voltage may be any suitable voltage; including, for example, a ground voltage, a common plate voltage, etc. In some embodiments, at least one of the reference voltages 72-75 may be different than at least one other of the reference voltages 72-75.

Figure 1:
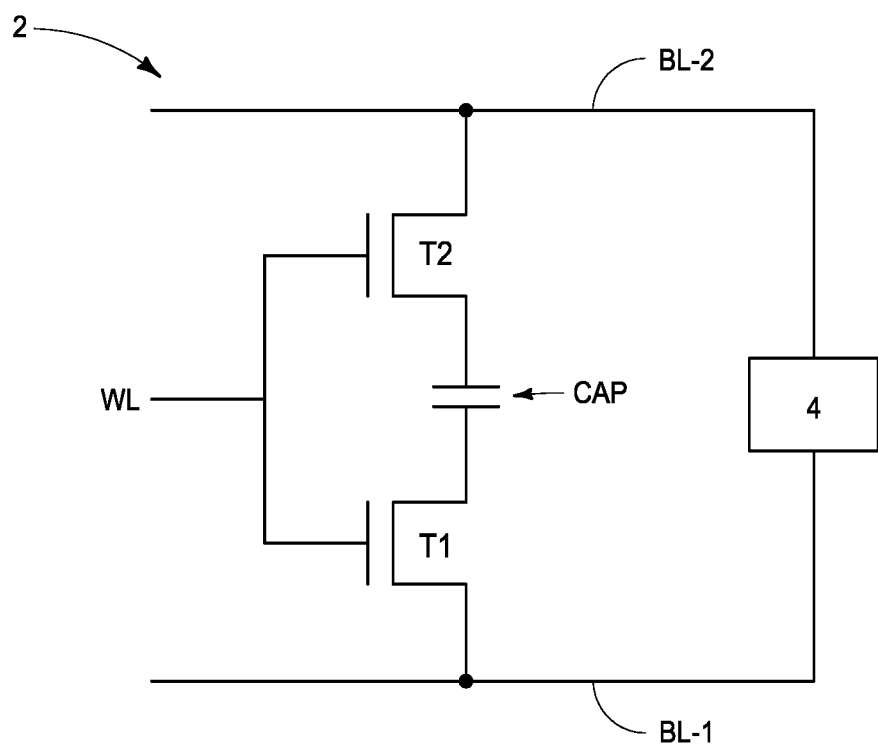
FIG. 1 is a schematic diagram of a prior art memory cell having 2 transistors and 1 capacitor.

The first transistors 26*a* and 26*b* comprise transistor gates 27*a* and 27*b*, respectively; and the second transistors 28*a* and 28*b* comprise transistor gates 29*a* and 29*b*, respectively. The transistor gates 27*a*, 27*b*, 29*a* and 29*b* are coupled with a wordline 38, which corresponds to the wordline WL of FIG. 1. In the illustrated embodiment, the transistor gates are comprised by regions of the wordline 38 proximate the semiconductor pillars 40-43.

The wordline 38 may comprise any suitable electrically conductive material, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

Each memory cell (24*a* and 24*b*) includes a capacitor; with the capacitor of memory cell 24*a* being labeled as capacitor 30*a*, and the capacitor of memory cell 24*b* being labeled as capacitor 30*b*. The capacitors correspond to the capacitor labeled CAP in FIG. 1.

Each capacitor includes a first node (i.e. first electrode) 32, a second node (i.e. second electrode) 34, and a dielectric material 36 between the first and second nodes.

The first and second nodes 32 and 34 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The first and second nodes 32 and 34 may comprise the same composition as one another in some embodiments, and may comprise different compositions than one another in other embodiments.

The dielectric material 36 may comprise any suitable composition or combination of compositions; and in some embodiments may comprise one or more of silicon dioxide, silicon nitride, aluminum oxide, hafnium oxide, zirconium oxide, etc. In some embodiments, the dielectric material 36 may be referred to as capacitor dielectric material, and may be considered to be a capacitor dielectric film between the first and second electrodes 32 and 34.

The first capacitor 30*a* has the first node 32 coupled with the first source/drain region 51 of the first transistor 26*a*, and has the second node 34 coupled with the third source/drain region 55 of the second transistor 28*a*. The second capacitor 30*b* has the first node 32 coupled with the fifth source/drain region 59 of the third transistor 26*b*, and has the second node 34 coupled with the seventh source/drain region 63 of the fourth transistor 28*b*.

The pillars 40 and 41 of the first memory cell 24*a* are coupled to the comparative bitlines 76*a* and 78*a*, respectively, through a pair of the spacing regions 79. The comparative bitlines 76*a* and 78*a* are analogous to the bitlines BL-1 and BL-2 of FIG. 1, and extend to circuitry 4A (e.g., a sense amp) suitable for comparing electrical properties (e.g., voltage) of the comparative bitlines 76*a* and 78*a* to ascertain a memory state of the memory cell 24*a*. Similarly, the pillars 42 and 43 of the second memory cell 24*b* are coupled to comparative bitlines 76*b* and 78*b*, respectively through a pair of the spacing regions 79. The comparative bitlines 76*b* and 78*b* extend to circuitry 4B (e.g., a sense amp) suitable for comparing electrical properties (e.g., voltage) of the comparative bitlines 76*b* and 78*b* to ascertain a memory state of the memory cell 24*b*.

The comparative bitlines 76*a*, 78*a*, 76*b* and 78*b* may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The comparative bitlines 76*a*, 78*a*, 76*b* and 78*b* are supported by the insulative material 7 described above with reference to FIG. 2.

The insulative material 3 extends around the memory cells 24*a* and 24*b*, and along the wordline 38. Regions of the insulative material 3 between the wordline 38 and the vertical pillars 40-43 may correspond to gate dielectric, and may have a different composition than other regions of the insulative material 3.

The memory cell 24*a* of FIG. 3 may be considered to be an example of a memory cell which is vertically offset from the underlying substrate 21. The memory cell 24*a* has first and second transistors 26*a* and 28*a* laterally offset relative to one another, and has a capacitor 30*a* which is vertically offset relative to the first and second capacitors 26*a* and 28*a*. The memory cell 24*b* may be considered to be an example of an analogous memory cell which is vertically offset from the underlying substrate 21.

In operation, a combination of voltages may be applied to a wordline and a pair of comparative bitlines to uniquely access a memory cell of the memory array 22. For instance, a combination of voltages may be applied to the wordline 38 and the comparative bitlines 76*a* and 78*a* to uniquely access the memory cell 24*a*. Voltages may also be applied along the body connection lines (e.g., the body connection lines 65 and 67 of the first memory cell 24*a*) during the access of the memory cell. The voltages on the body connection lines may be utilized to encourage, or discourage, charge build-up within body regions (e.g., body regions 64 and 66 of the first memory cell 24*a*) according to the desired operation, providing control over leakage currents and threshold voltages. The second memory cell 24*b* may be operated analogously using the wordline 38, comparative bitlines 76*b*/78*b*, and body connection lines 69/71.

Figure 4:
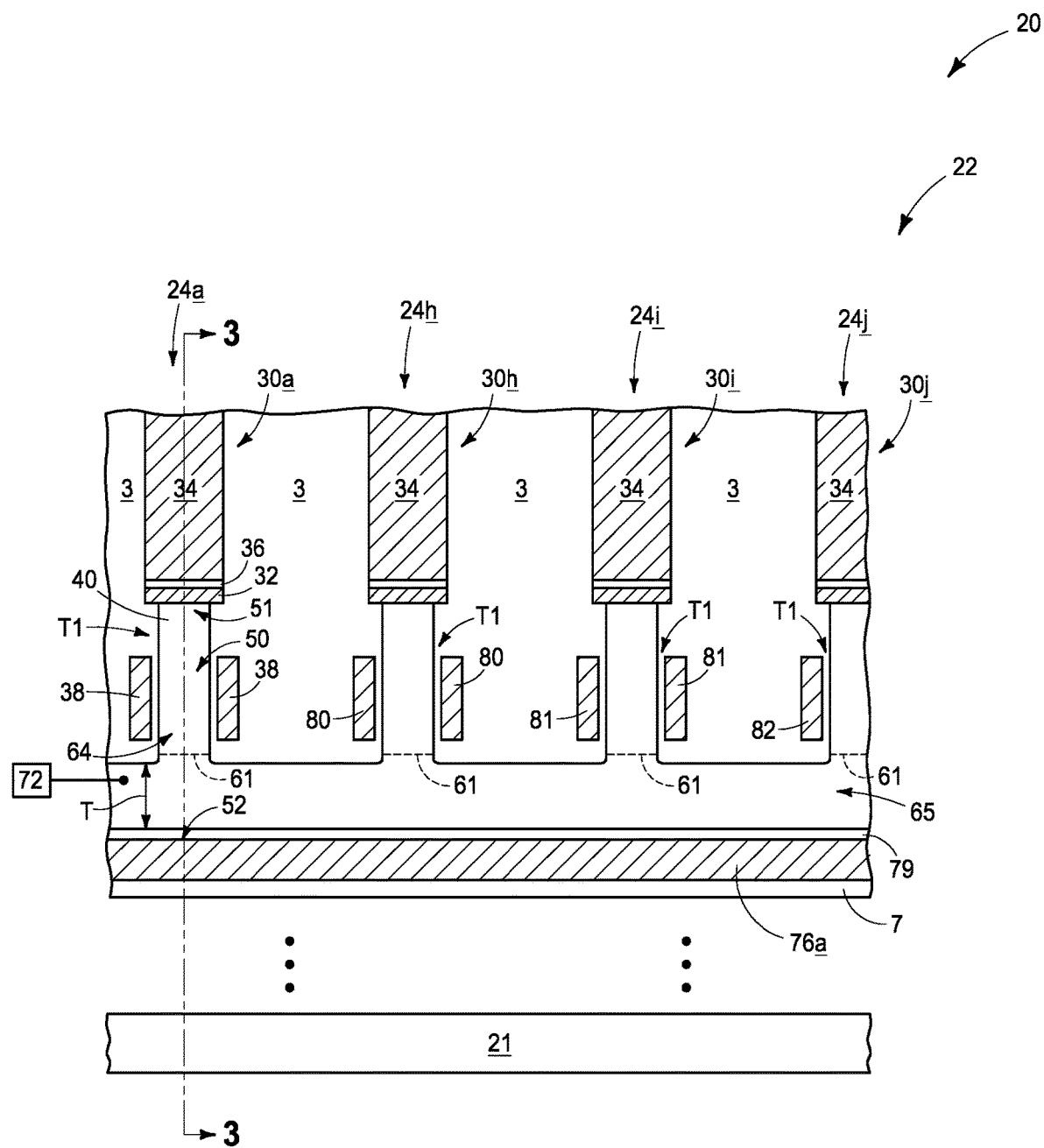
FIGS. 4 and 5 are diagrammatic cross-sectional side views of the memory array of FIG. 3 shown along a cross-section orthogonal to that of FIG. 3.

FIG. 4 shows a cross-section of memory array 22 along a plane orthogonal to the plane of FIG. 3, and along the line 4/5-4/5 of FIG. 3. FIG. 4 shows the memory cell 24a together with additional memory cells 24h, 24i and 24j. The memory cells 24h, 24i and 24j include capacitors 30h, 30i and 30j, respectively.

The memory cells 24h, 24i and 24j include T1 transistors analogous to the T1 transistor of memory cell 24a; and include semiconductor pillars (not labeled) analogous to the semiconductor pillar 40 of memory cell 24a. The semiconductor pillars of the memory cells 24h, 24i and 24j are alongside wordlines 80, 81 and 82; analogous to the wordline 38 alongside the semiconductor pillar 40 of memory cell 24a.

The comparative bitline 76a extends along the plane of the cross-section of FIG. 4, and the body connection line (structure) 65 is over the comparative bitline 76a and extends substantially parallel to such comparative bitline (with the term "substantially parallel" meaning parallel to within reasonable tolerances of fabrication and measurement). Although the body connection structure 65 is referred to as a "line", it is to be understood that the body connection structure 65 may have any suitable configuration; and in some embodiments may be curved, wavy, etc.

The body connection line 65 may comprise doped semiconductor material; and in some embodiments may comprise, consist essentially of, or consist of one or both of silicon and germanium having appropriate dopant therein. The body connection line 65 may have an opposite conductivity type relative to the source/drain regions 51 and 52. For instance, in embodiments in which the source/drain regions 51 and 52 are n-type regions (i.e., have n-type carriers as the majority carrier type), the body connection line 65 may be a p-type region (i.e., may have p-type carriers as the majority carrier type); and in embodiments in which the source/drain regions are p-type regions, the body connection line 65 may be an n-type region. In the shown embodiment, the body connection line 65 is spaced from the comparative bitline 76a by the spacing region 79. The spacing region 79 is configured as a line which is substantially parallel to the body connection line 65 and the comparative bitline 76a, and which is sandwiched between the body connection line 65 and the comparative bitline 76a. The spacing region 79 may comprise the same semiconductor material as the body connection line 65 in some embodiments, and may comprise a different semiconductor material than the body connection line 65 in other embodiments. The spacing region 79 is conductively-doped, and comprises the source/drain region 52.

Notably, the source/drain region 52 is spaced from the channel region 50 by a thickness T of the body connection line 65. In some embodiments, it may be desired for the thickness T of the body connection line 65 to be relatively large, as such may reduce resistance along the body connection line. However, the large thickness T may decrease conductivity between the comparative bitline 76a and the channel region 50, which may decrease drive current—resulting in slower operational speed. Accordingly, the optimal thickness T may be a compromise between the desired large thickness for achieving low resistance along the body connection line 65, and the narrow thickness for achieving strong coupling between the comparative bitline 76a and the channel region 50. In some example embodiments (for instance, an embodiment discussed below relative to FIG. 7), wordline shapes may be modified to compensate, at least in part, for the enhanced thickness of a body connection line.

Figure 5:
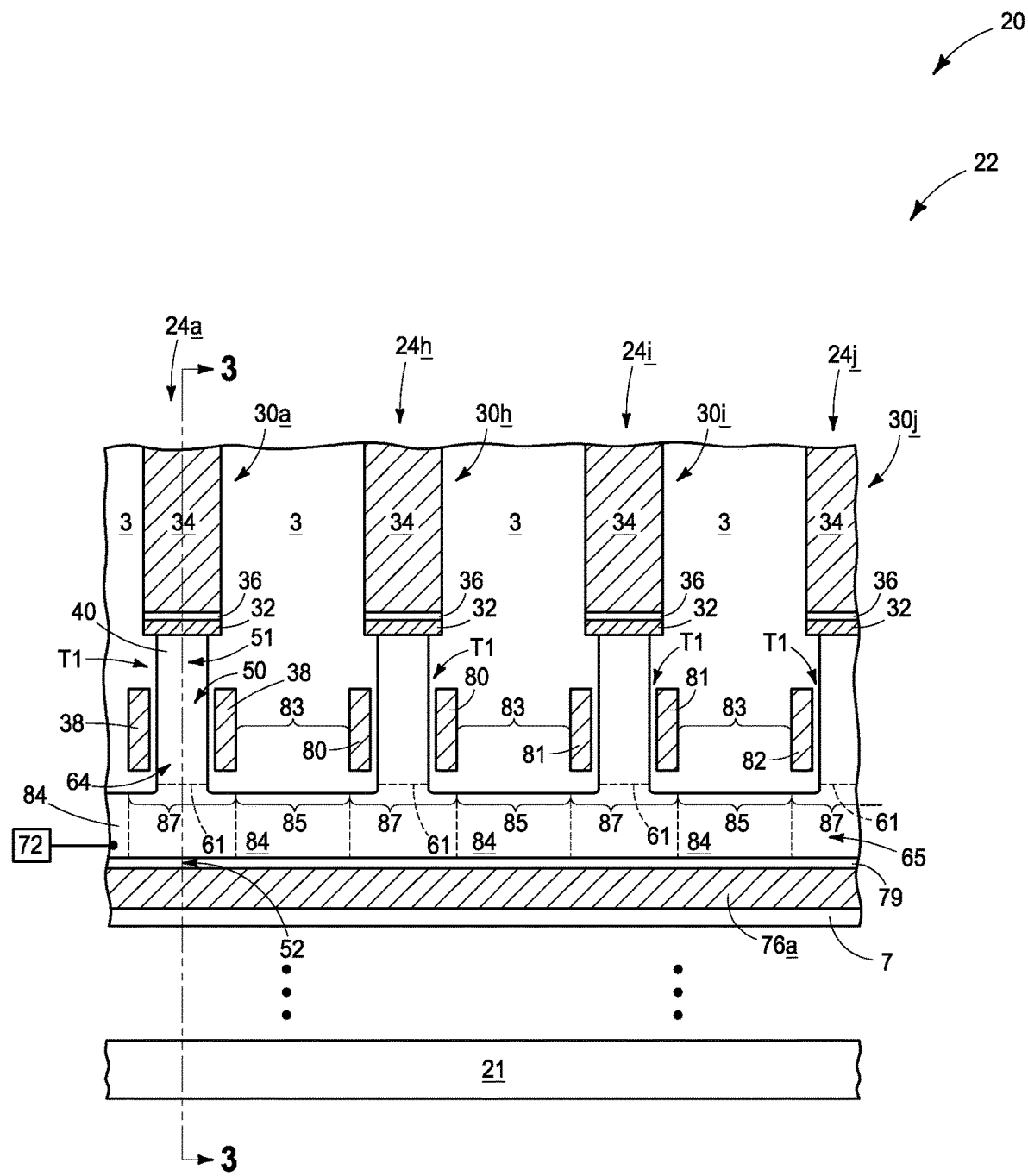

FIG. 5 shows a cross-section analogous to that of FIG. 4, but in accordance with an embodiment in which pocket regions 84 are formed along the body connection line 65. Such pocket regions may have higher charge carrier concentration than other regions of the body connection line, and may enhance conductivity along the body connection line 65. The pocket regions 84 may be formed after the wordlines 38, 80, 81 and 82 by implanting dopant into the body connection line 65 while using the wordlines as a mask. In some embodiments, the apparatus 20 may be heated after forming the pocket regions 84, which may diffuse dopant from the pocket regions 84 into other regions of the body connection line 65. In some embodiments, the wordlines 38, 80, 81 and 82 may be considered to be spaced apart from one another by intervening regions 83, and the pocket regions 84 may be considered to be formed within segments 85 of the body connection line 65 that are vertically offset from the intervening regions 83 (and in the shown embodiment are directly below the intervening regions 83). In some embodiments, the body connection line 65 may be considered to comprise the segments 85 having the pocket regions 84, and to comprise regions 87 between the segments 85. The segments 85 and regions 87 may both comprise a same majority charge carrier type (e.g., may both be p-type); with the segments 85 comprising a higher concentration of charge carriers than the regions 87.

The body connection lines 67, 69 and 71 may comprise the same configurations as described relative to the body connection line 65.

Figure 6:
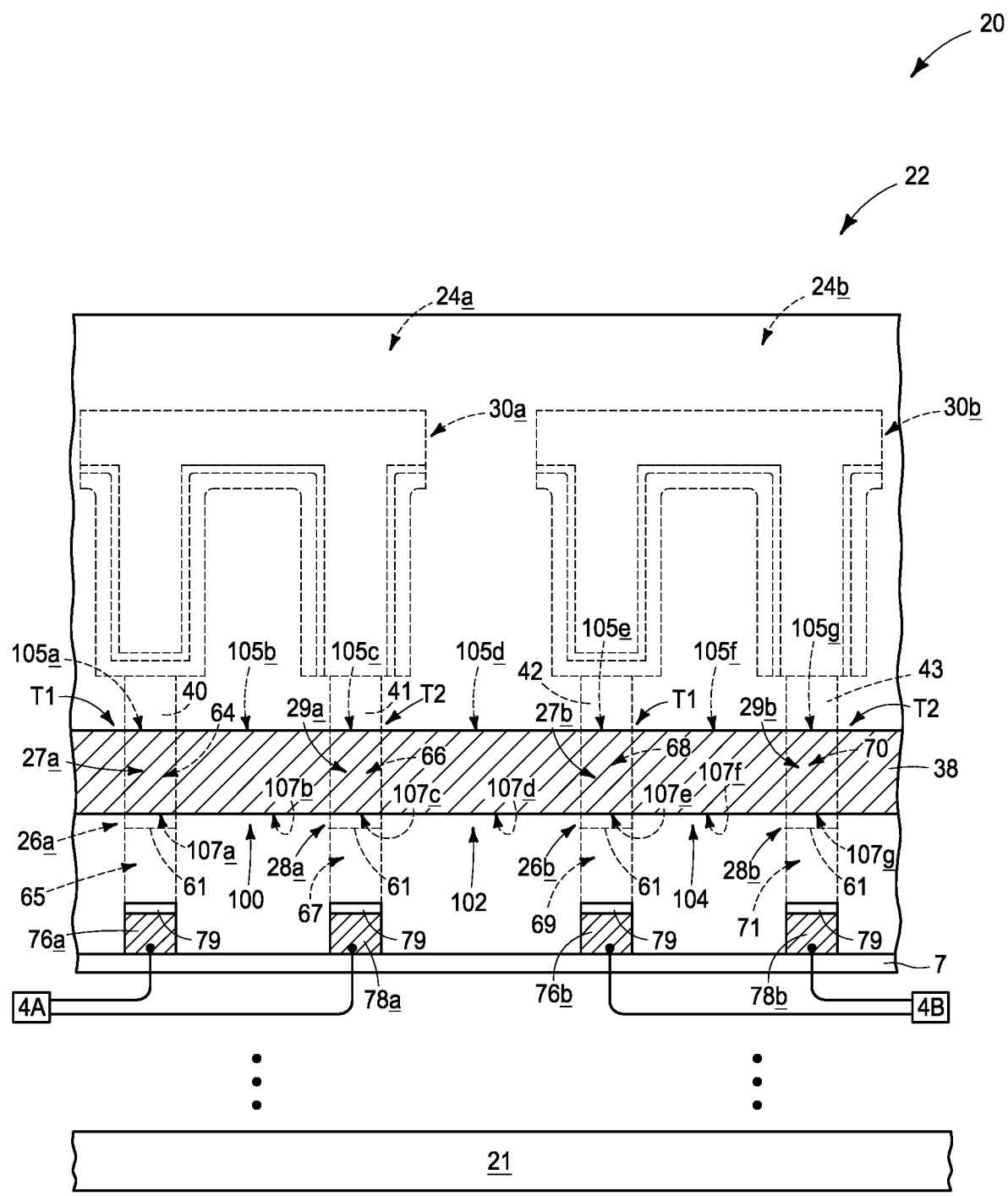
FIGS. 6 and 7 are diagrammatic cross-sectional side views of the memory array of FIG. 3 shown along a cross-section out-of-plane relative to the cross-section of FIG. 3.

FIG. 6 shows the memory array 22 along a cross-section parallel to the cross-section of FIG. 3, but offset relative to the cross-section of FIG. 3. The cross-section of FIG. 6 is along the wordline 38. The capacitors 30a and 30b are behind the plane of the cross-section of FIG. 6, and accordingly are shown in dashed-line (i.e., phantom) view. The pillars 40-43 are also behind the plane of the cross-section of FIG. 6, and are also shown in dashed-line view.

The wordline 38 may be considered to comprise a first gate region along the first transistor 26a, with the first gate region corresponding to the gate 27a; a second gate region along the second transistor 28a, with the second gate region corresponding to the gate 29a; a third gate region along the third transistor 26b, with the third gate region corresponding to the gate 27b; and a fourth gate region along the fourth transistor 28b, with the fourth gate region corresponding to the gate 29b. The first, second, third and fourth gate regions 27a, 29a, 27b and 29b are proximate the first, second, third and fourth body regions 64, 66, 68 and 70, respectively (with the body regions 64, 66, 68 and 70 being within regions of the pillars 40-43 behind the plane of the cross-section of FIG. 6, and accordingly being indicated with dashed-arrows in FIG. 6).

The wordline 38 comprises a first segment 100 between the first and second gate regions 27a and 29a, a second segment 102 between the second and third gate regions 29a and 27b, and a third segment 104 between the third and fourth gate regions 27b and 29b.

In some embodiments, the first gate region 27a of the wordline 38 may be considered to have an upper surface 105a and a lower surface 107a; the second gate region 29a may be considered to have an upper surface 105c and a lower surface 107c; the third gate region 27b may be considered to have an upper surface 105e and a lower surface 107e; and the fourth gate region 29b may be considered to have an upper surface 105g and a lower surface 107g. The first segment 100 of the wordline 38 may be considered to have an upper surface 105b and a lower surface 107b; the second segment 102 of the wordline 38 may be considered to have an upper surface 105d and a lower surface 107d; and the third segment 104 of the wordline 38 may be considered to have an upper surface 105f and a lower surface 107f.

In some embodiments, the upper surfaces 105a and 105c of the first and second gate regions 27a and 29a may be referred to as first and second upper surfaces, and the upper surface 105b of the first segment 100 of wordline 38 may be referred to as a third upper surface. Also, the lower surfaces 107a and 107c of the first and second gate regions 27a and 29a may be referred to as first and second lower surfaces, and the lower surface 107b of the first segment 100 of wordline 38 may be referred to as a third lower surface. In the shown embodiment, the third upper surface 105b is substantially planar with the first and second upper surfaces 105a and 105c (with the term "substantially planar" meaning planar to within reasonable tolerances of fabrication and measurement). Also, the third lower surface 107b is substantially planar with the first and second lower surfaces 107a and 107c. In the specific application of FIG. 6, an entire upper surface of the wordline 38 is substantially planar, and an entire lower surface of the wordline 38 is substantially planar.

The embodiment of FIG. 6 may be suitable if the thicknesses of the body connection lines (e.g., the thickness T of the body connection line 65 shown in FIG. 4) are sufficiently thin that there is suitable electrical coupling between the channel regions of the transistors (e.g., transistor 26a) and the source/drain regions on opposing sides of the body connection lines from the channel regions (e.g., the source/drain region 52 (shown in FIG. 4)). In other embodiments, it may be desired to modify the shapes of the wordlines in order to enhance electrical coupling through the body connection lines proximate the wordlines. For instance, FIG. 7 shows memory array 22 along the same plane as is used in FIG. 6, but in accordance with an embodiment in which the wordline 38 is modified relative to the embodiment of FIG. 6.

Figure 7:
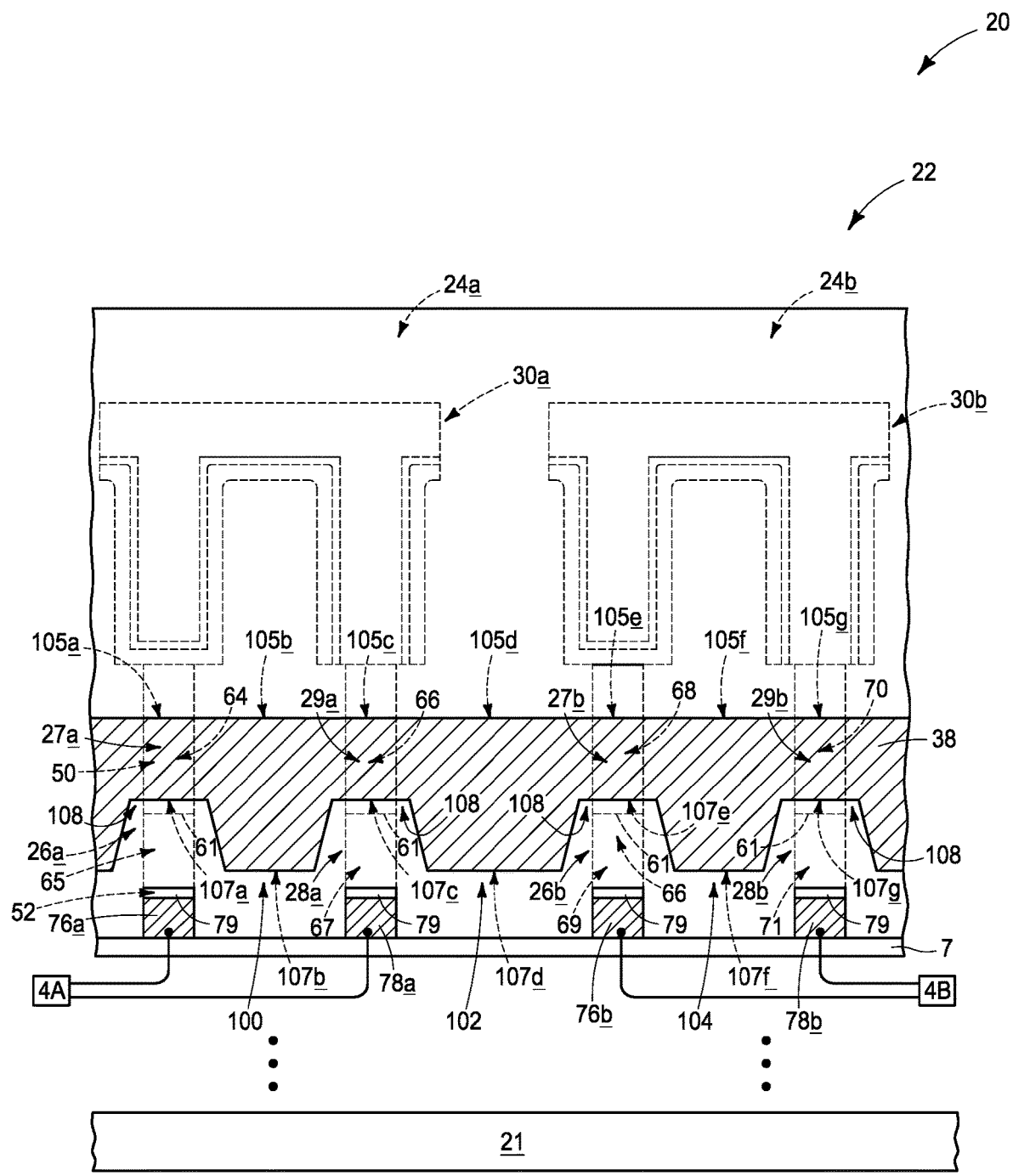

The wordline 38 of FIG. 7 has the upper surfaces 105a, 105b, 105c, 105d, 105e, 105f and 105g all substantially planar to one another, like the wordline 38 of FIG. 6. However, unlike the wordline 38 of FIG. 6, some of the lower surfaces of the wordline 38 of FIG. 7 are vertically offset relative to others. Specifically, the lower surfaces 107b, 107d and 107f of the wordline segments 100, 102 and 104 are vertically offset to be beneath the lower surfaces 107a, 107c, 107e and 107g of the gate regions 27a, 29a, 27b and 29b of the wordline 38. Such creates saddle regions 108 (or inset regions) where the wordline saddles the body connection lines 65, 67, 69 and 71. The vertical overlap of the wordlines across the body connection lines 65, 67, 69 and 71 provided by the saddle regions 108 may enable conductive channels to be formed within the body connection lines 65, 67, 69 and 71 when the voltage is applied along the wordline 38, which may enable effective electrical coupling between channel regions on one side of the body connection lines with source/drain regions on an opposing side of the body connection lines (e.g., between the channel region 50 and the source/drain region 52 diagrammatically shown relative to the transistor 26a). The saddle regions 108 may have any suitable shapes; including, for example, curved shapes, parabolic shapes, etc. The shape of the wordline may be tailored so that the saddle regions 108 vertically overlap the body connection lines 65, 67, 69 and 71 by a suitable amount.

Figure 8:
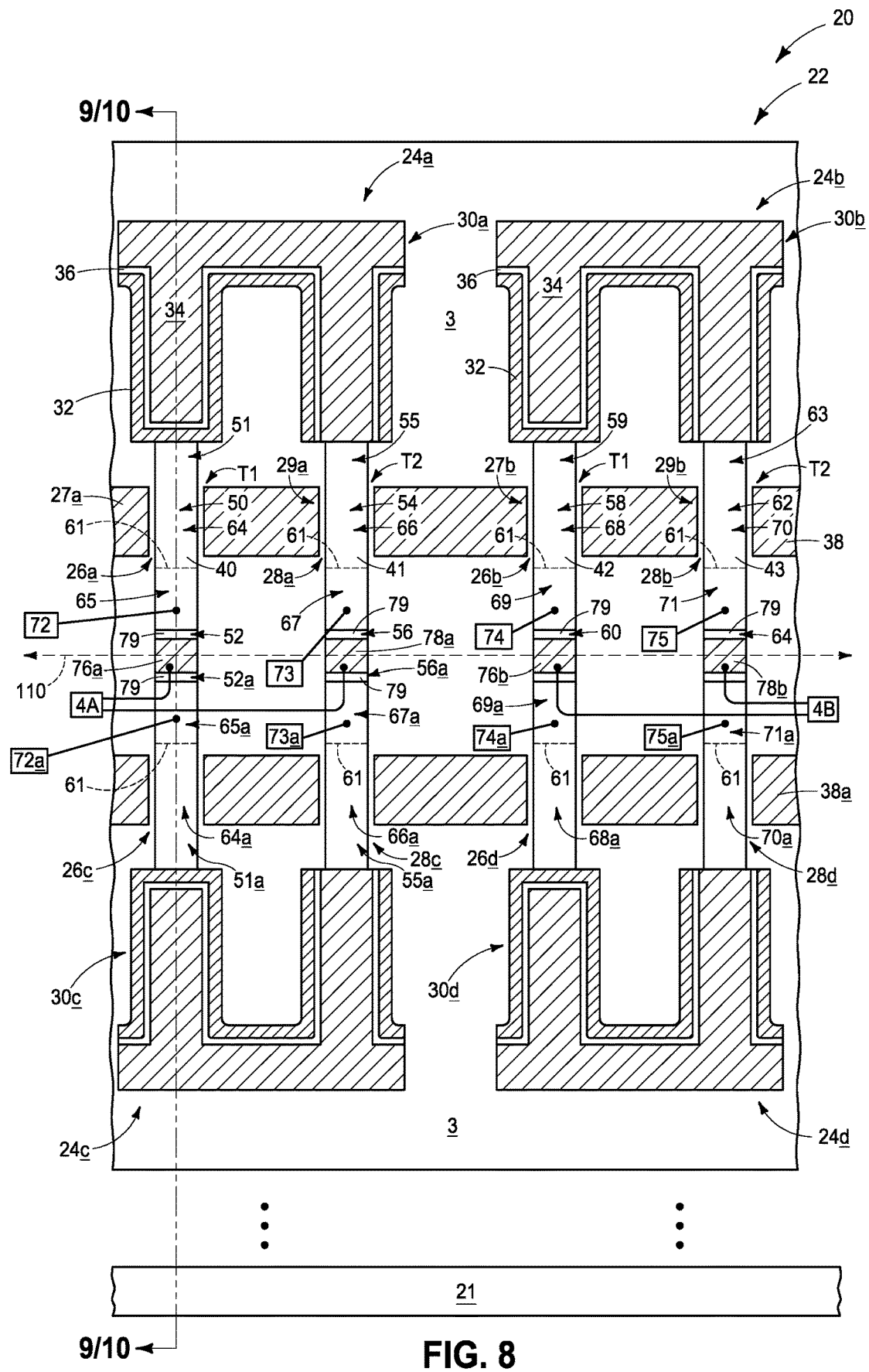
FIG. 8 is a diagrammatic cross-sectional side view of a region of another example memory array.

In some embodiments, memory cells 24a and 24b of the type described above with reference to FIG. 3 may be incorporated into a memory array in a configuration in which the comparative bitlines (e.g., comparative bitlines 76a, 78a, 76b, and 78b) are shared between memory cells. For instance, FIG. 8 shows a region of memory array 22 in a configuration in which the memory cell 24a shares comparative bitlines 76a and 78a with a memory cell 24c; and in which the memory cell 24b shares comparative bitlines 76b and 78b with a memory cell 24d. In the illustrated embodiment, an axis 110 extends through the comparative bitlines 76a, 78a, 76b and 78b, and defines a mirror plane. The memory cells 24c and 24d on one side of the mirror plane are substantially mirror images of the memory cells 24a and 24b on an opposing side of the mirror plane; where the term "substantially mirror image" means a mirror image to within reasonable tolerances of fabrication and measurement. In some embodiments, the memory cells 24a and 24c may be referred to as first and second memory cells, respectively; with such memory cells being substantially mirror images of one another relative to the plane 110 extending through the shared comparative bitlines 76a and 78a.

The memory array 22 of FIG. 8 is shown comprising a second wordline 38a vertically offset from the first wordline 38; with the second wordline 38a extending across transistors 26c, 28c, 26d and 28d of the memory cells 24c and 24d.

The memory cells 24a and 24b have the body regions 64, 66, 68 and 70 described above with reference to FIG. 3; and the memory cells 24c and 24d have analogous body regions 64a, 66a, 68a and 70a. The body regions 64, 66, 68 and 70 are coupled with body connection lines 65, 67, 69 and 71; and the body regions 64a, 66a, 68a and 70a are coupled with analogous body connection lines 65a, 67a, 69a and 71a. The body connection lines 65, 67, 69 and 71 extend to reference voltages 72, 73, 74 and 75; and the body connection lines 65a, 67a, 69a and 71a extend to analogous reference voltages 72a, 73a, 74a and 75a. The reference voltages 72, 73, 74, 75, 72a, 73a, 74a and 75a may all be the same as one another. Alternatively, one or more of the reference voltages 72, 73, 74, 75, 72a, 73a, 74a and 75a may be different than one or more others of the reference voltages 72, 73, 74, 75, 72a, 73a, 74a and 75a.

The body connection lines 65a, 67a, 69a and 71a may comprise any of the materials described above relative to the body connection lines 65, 67, 69 and 71; and in some embodiments may comprise conductively-doped semiconductor material (e.g., conductively-doped silicon, conductively doped germanium, etc.).

The body connection lines 65a, 67a, 69a and 71a are spaced from the comparative bitlines 76a, 78a, 76b and 78b by spacing regions 79. In some embodiments, the body connection lines 65a, 67a, 69a and 71a may comprise semiconductor material doped to a first conductivity type (e.g., n-type or p-type), and the spacing regions may comprise semiconductor material doped to a second conductivity type different from the first conductivity type.

In some embodiments, the transistors 26a and 28a are considered transistors of a first memory cell 24a; and such transistors comprise first, second, third and fourth source/drain regions 51, 52, 55 and 56, respectively. The transistors 26c and 28c are considered transistors of a second memory cell 24c; and such transistors comprise fifth, sixth, seventh and eighth source/drain regions 51a, 52a, 55a and 56a, respectively. The second, fourth, sixth and eighth source/drain regions 52, 56, 52a and 56a are within the spacing regions 79.

The body connection lines 65, 67, 69 and 71 extend substantially parallel to the comparative bitlines 76a, 78a, 76b and 78b, and extend in and out of the page relative to the cross-sectional view of FIG. 8. Similarly, the body connection lines 65a, 67a, 69a and 71a extend substantially parallel to the comparative bitlines 76a, 78a, 76b and 78b, and extend in and out of the page relative to the cross-sectional view of FIG. 8. In some embodiments, the body connection lines 65 and 67 may be referred to as first body connection lines associated with a first memory cell 24a; and the body connection lines 65a and 67a may be referred to as third and fourth body connection lines associated with a second memory cell 24c. In such embodiments, the first and third body connection lines 65 and 65a may be considered to be substantially parallel to one another and to the first comparative bitline 76a; and the second and fourth body connection lines 67 and 67a may be considered to be substantially parallel to one another and to the second comparative bitline 78a.

Figure 9:
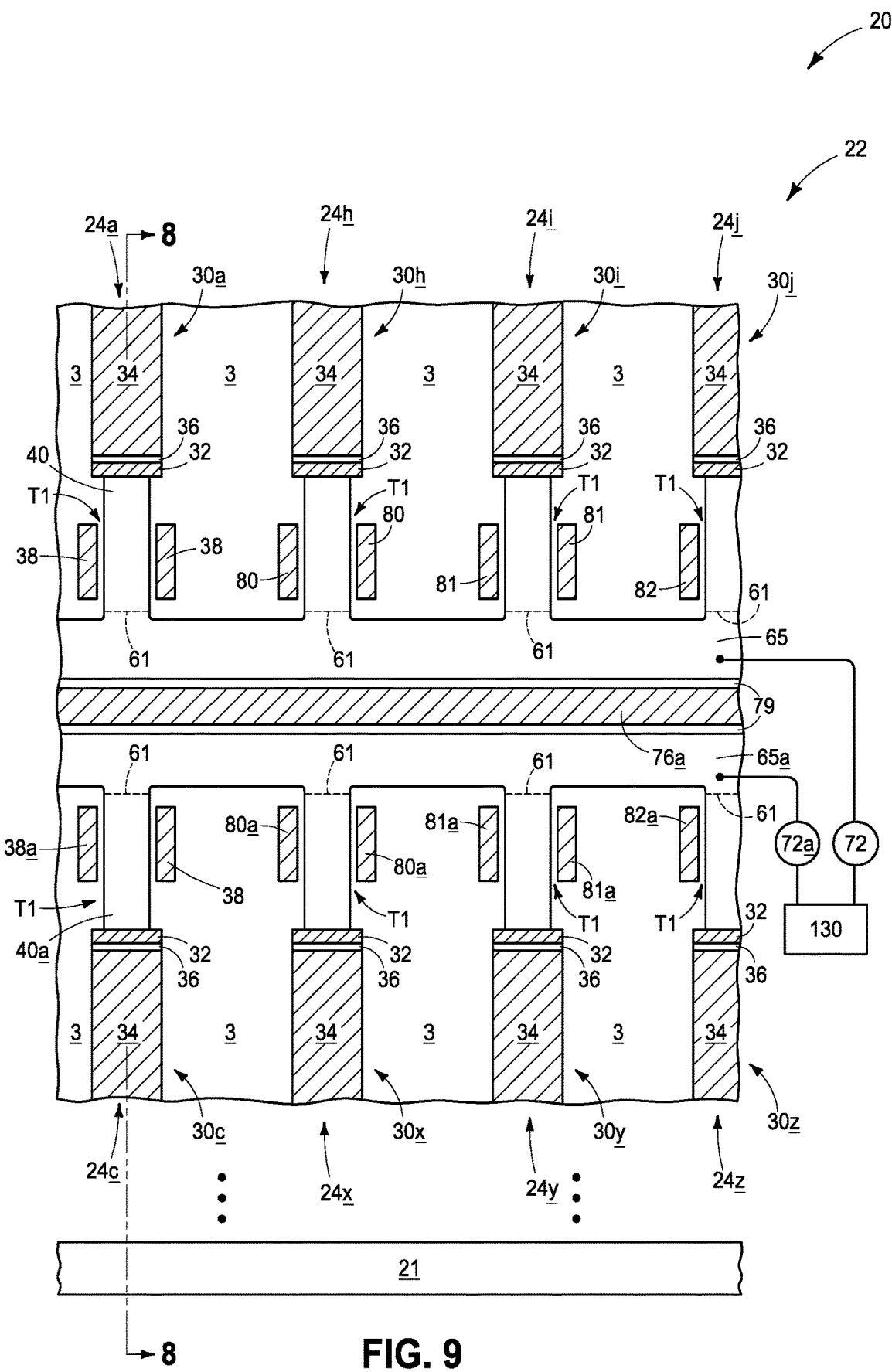
FIGS. 9 and 10 are diagrammatic cross-sectional side views of the memory array of FIG. 8 shown along a cross-section orthogonal to that of FIG. 8.

FIG. 9 shows a region of memory array 22 along a plane orthogonal to the plane of FIG. 8, and along the line 9/10-9/10 of FIG. 8. FIG. 9 is similar to the view of FIG. 4 (described above), and shows the memory cells 24a and 24c together with additional memory cells 24h, 24i, 24j, 24x, 24y and 24z. The memory cells 24h, 24i, 24j, 24x, 24y and 24z include capacitors 30h, 30i, 30j, 30x, 30y and 30z, respectively.

The memory cells 24h, 24i, 24j, 24x, 24y and 24z include T1 transistors analogous to the T1 transistors of memory cells 24a and 24c; and include semiconductor pillars (not labeled) analogous to the semiconductor pillars 40 and 40a of memory cell 24a and 24c. The semiconductor pillars of the memory cells 24h, 24i, 24j, 24x, 24y and 24z are alongside wordlines 80, 81, 82, 80a, 81a and 82a; analogous to the wordlines 38 and 38a alongside the semiconductor pillars 40 and 40a of memory cells 24a and 24c.

The comparative bitline 76a extends along the plane of the cross-section of FIG. 9. The body connection line 65 is over the comparative bitline 76a and extends substantially parallel to such comparative bitline, and the body connection line 65a is under the comparative bitline 76a and extends substantially parallel to the comparative bitline. In the shown embodiment, the body connection lines 65 and 65a are coupled with a controller 130 configured to provide desired reference voltages 72 and 72a to the body connection lines 65 and 65a. The controller may include control circuitry (such as, for example, logic circuitry) in some embodiments, or may simply be a plate or other structure held at ground or other fixed voltage in other embodiments.

The spacing regions 79 are configured as lines which are substantially parallel to the body connection lines 65 and 65a, and to the comparative bitline 76a.

Figure 10:
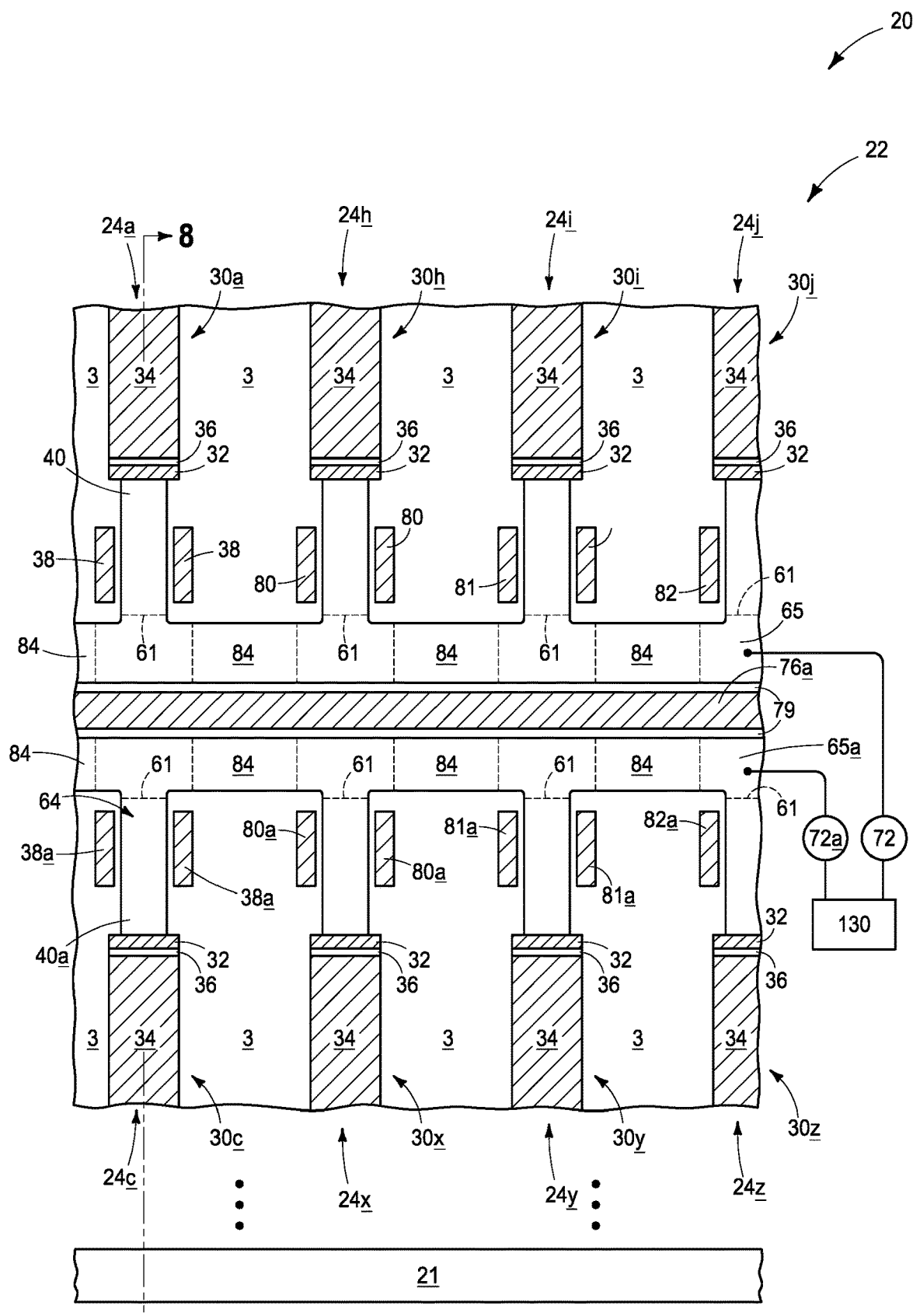

FIG. 10 shows a cross-section analogous to that of FIG. 9, but in accordance with an embodiment in which pocket regions 84 are formed along the body connection lines 65 and 65a (similar to the construction described above with reference to FIG. 5). Such pocket regions may provide the same advantages as those described above with reference to FIG. 5.

Figure 11:
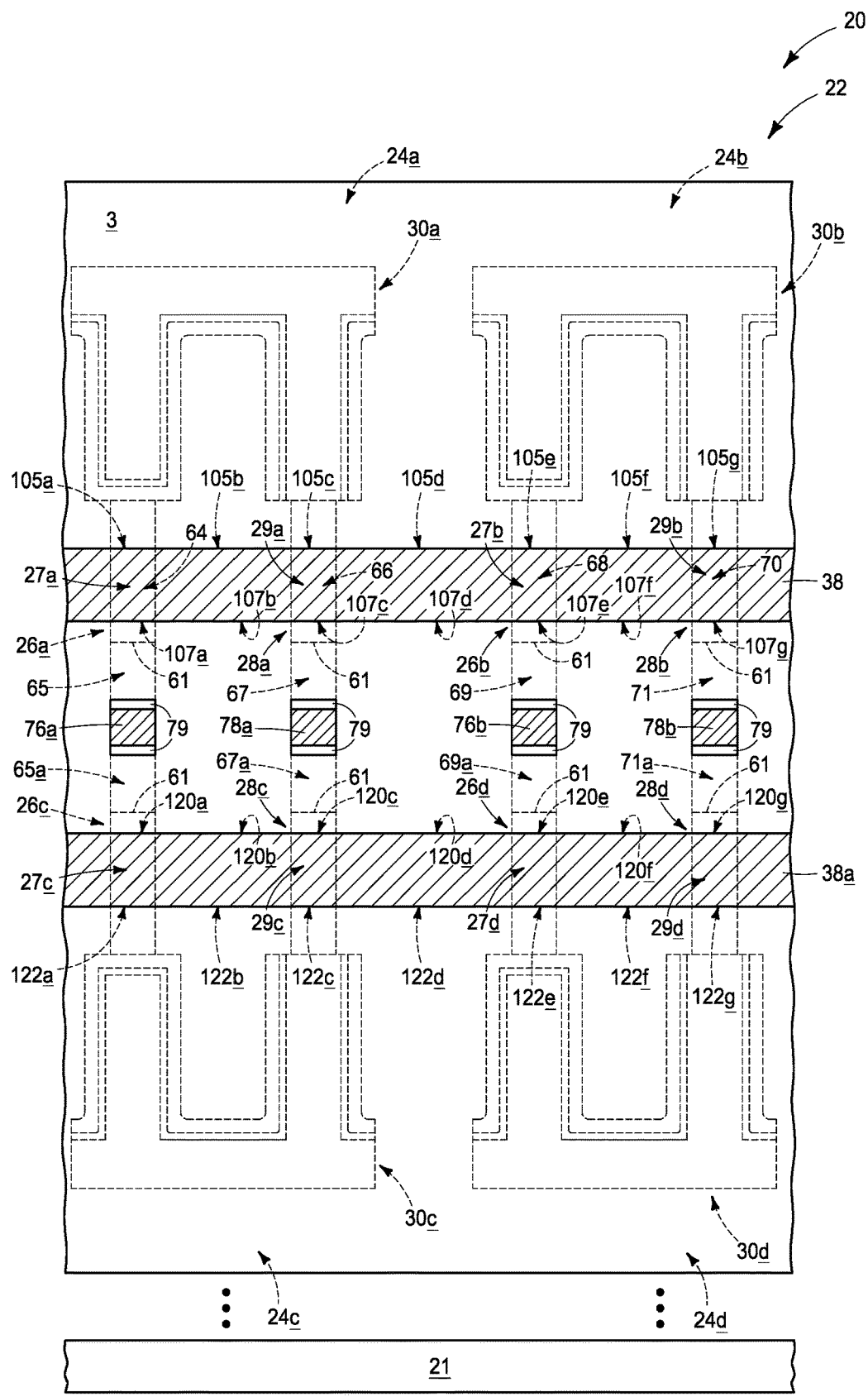
FIGS. 11 and 12 are diagrammatic cross-sectional side views of the memory array of FIG. 8 shown along a cross-section out-of-plane relative to the cross-section of FIG. 8.

FIG. 11 shows the memory array 22 along a cross-section parallel to the cross-section of FIG. 8, but offset relative to the cross-section of FIG. 8. The cross-section of FIG. 11 is along the wordlines 38 and 38a. The capacitors 30a, 30b, 30c and 30d are behind the plane of the cross-section of FIG. 11, and accordingly are shown in dashed-line view.

The wordline 38 comprises the first, second, third and fourth gate regions 27a, 29a, 27b and 29b; and similarly the wordline 38a comprises seventh, eighth, ninth and tenth gate regions 27c, 29c, 27d and 29d.

The wordline 38 comprises the upper surfaces 105a, 105b, 105c, 105d, 105e, 105f and 105g; and the lower surfaces 107a, 107b, 107c, 107d, 107e, 107f and 107g described above with reference to FIG. 6. The wordline 38a comprises analogous upper surfaces 120a, 120b, 120c, 120d, 120e, 120f and 120g; and analogous lower surfaces 122a, 122b, 122c, 122d, 122e, 122f and 122g.

In the embodiment of FIG. 11, the upper surfaces 105a, 105b, 105c, 105d, 105e, 105f and 105g of the wordline 38 are all substantially parallel to one another; and the lower surfaces 107a, 107b, 107c, 107d, 107e, 107f and 107g of the wordline 38 are all substantially parallel to one another. Also, the upper surfaces 120a, 120b, 120c, 120d, 120e, 120f and 120g of the wordline 38a are all substantially parallel to one another; and the lower surfaces 122a, 122b, 122c, 122d, 122e, 122f and 122g of the wordline 38a are all substantially parallel to one another.

The embodiment of FIG. 11, like that of FIG. 6, may be suitable if the thicknesses of the body connection lines (e.g., the thicknesses of the body connection lines 65 and 65a of FIG. 8) are sufficiently thin that there is suitable electrical coupling between the channel regions of the transistors (e.g., transistors 26a and 26c) and the source/drain regions on opposing sides of the body connection lines from the channel regions (e.g., the source/drain regions 52 and 52a (shown in FIG. 8)). In other embodiments, it may be desired to modify the shapes of the wordlines, analogous to the modification discussed above with reference to FIG. 7. For instance, FIG. 12 shows memory array 22 along the same plane as used in FIG. 11, but in accordance with an embodiment in which the wordlines 38 and 38a are modified relative to the embodiment of FIG. 11.

Figure 12:
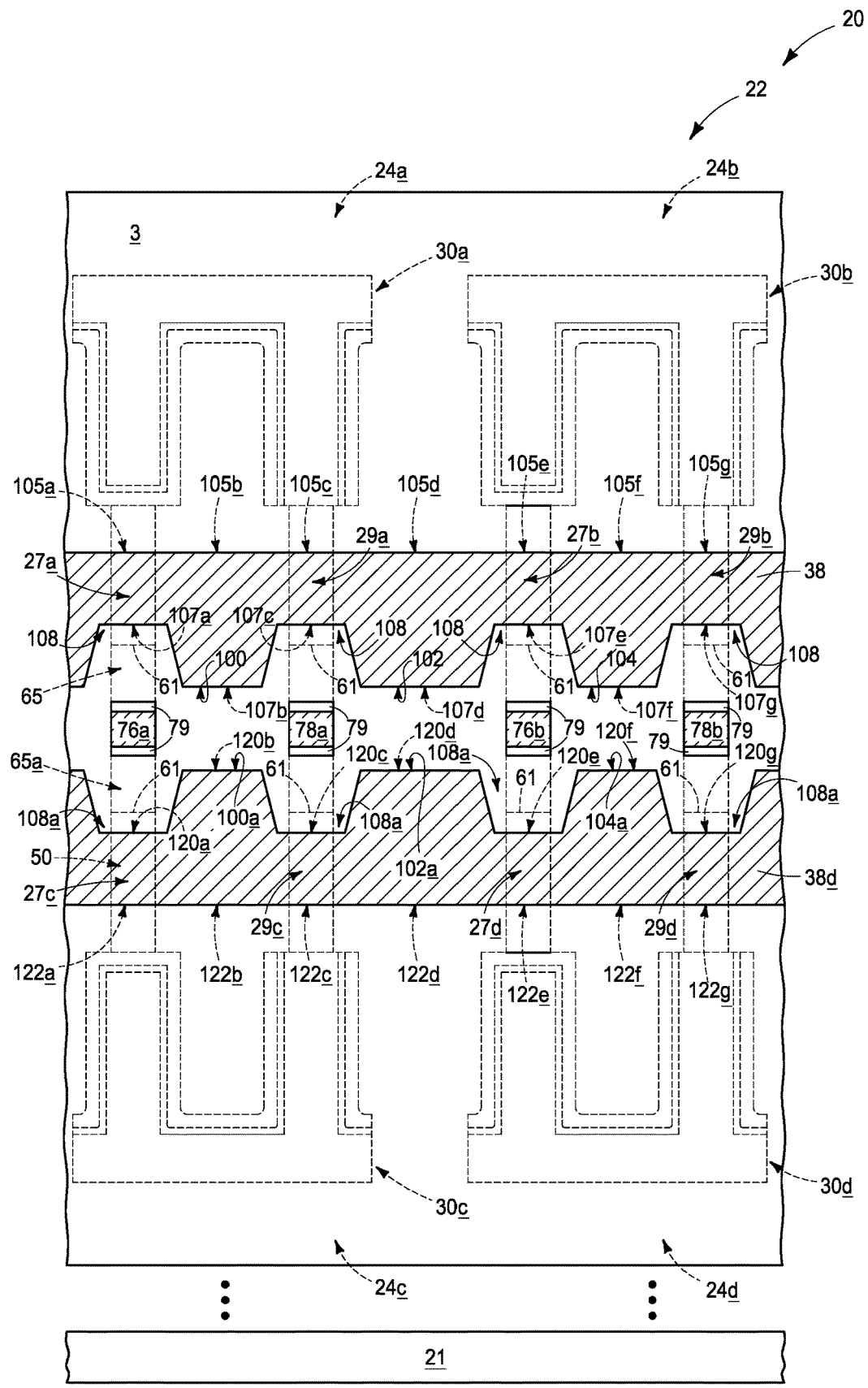

The wordline 38 of FIG. 12 has all of the upper surfaces 105a, 105b, 105c, 105d, 105e, 105f and 105g substantially planar to one another, and the wordline 38a of FIG. 12 has all of the lower surfaces 122a, 122b, 122c, 122d, 122e, 122f and 122g of the wordline 38a substantially planar to one another. However, the lower portion of the wordline 38 comprises saddle regions 108 like those discussed above with reference to FIG. 7, and the upper portion of wordline 38a comprises analogous saddle regions 108a.

In the shown embodiment, the lower surfaces 107b, 107d and 107f of wordline 38 are along the wordline segments 100, 102 and 104; and are vertically offset to be beneath the lower surfaces 107a, 107c, 107e and 107g of the gate regions 27a, 29a, 27b and 29b. Similarly, the upper surfaces 120b, 120d and 120f of wordline 38a are along the wordline segments 100a, 102a and 104a; and are vertically offset to be above the upper surfaces 120a, 120c, 120e and 120g of the gate regions 27c, 29c, 27d and 29d.

In some embodiments, the gate region 27c may be referred to as a first gate region having a first upper surface 120a, the gate region 29c may be referred to as a second gate region having a second upper surface 120c, and the segment 100a of wordline 38a may be considered to have a third upper surface 120b between the first and second upper surfaces (120a, 102c). The third upper surface 120b is vertically offset relative to the first and second upper surfaces 120a and 120c in the embodiment of FIG. 12, and specifically is above such first and second upper surfaces.

Figure 13:
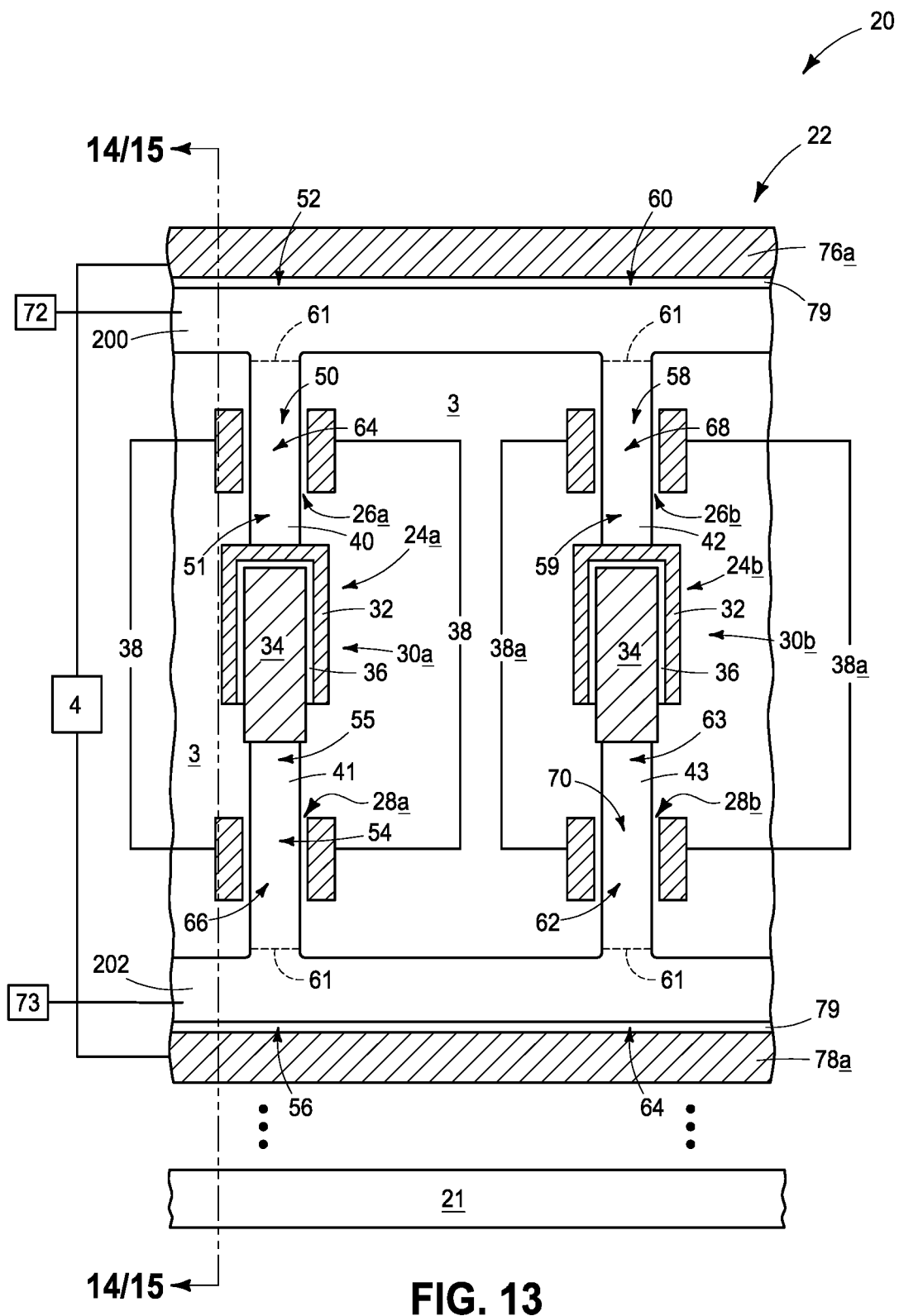
FIG. 13 is a diagrammatic cross-sectional side view of a region of another example memory array.

The 2T-1C memory cells of FIGS. 3-12 (e.g., memory cell 24a) have the transistors (e.g., transistors 26a and 28a) laterally adjacent to one another, and the capacitor (e.g., capacitor 30a) vertically offset relative to the transistors. In other embodiments, the transistors may be vertically offset relative to one another, as well as relative to the capacitor. For instance, FIG. 13 shows a region of an apparatus 20 comprising a memory array 22, with the illustrated region comprising a pair of memory cells 24a and 24b analogous to memory cells described above with reference to FIG. 3. However, each of the memory cells (24a and 24b) of FIG. 13 includes the two transistors vertically stacked one atop another, and comprises the capacitor between the transistors; with the transistors of memory cell 24a being the transistors 26a and 28a, and the capacitor of memory cell 24a being the capacitor 30a; and with the transistors of memory cell 24b being the transistors 26b and 28b, and the capacitor of memory cell 24b being labeled the capacitor 30b. In some embodiments, the transistors 26a, 28a, 26b and 28b may be referred to as first, second, third and fourth transistors, respectively; and the capacitors 30a and 30b may be referred to as first and second capacitors, respectively.

The capacitors 30a and 30b include the first nodes 32, second nodes 34, and dielectric material 36 described above with reference to FIG. 3.

The adjacent memory cells 24a and 24b of FIG. 3 shared a common wordline. In contrast, the adjacent memory cells 24a and 24b of FIG. 13 share a digit line; with such digit line comprising the comparative bitlines 76a and 78a. The comparative bitlines 76a and 78a extend to circuitry 4 which may compare electrical properties of the comparative bitlines.

The semiconductor pillars 40-43 extend vertically from the comparative bitlines 76a and 78a, and are spaced from such comparative bitlines by the spacing regions 79.

The transistors 26a, 28a, 26b and 28b include the source/drain regions 51, 55, 59 and 63 within the semiconductor pillars 40-43, and also include the channel regions 50, 54, 58 and 62 within semiconductor pillars 40-43. Additionally, the transistors 26a, 28a, 26b and 28b include the source/drain regions 52, 56, 60 and 64 within spacing regions 79 adjacent the pillars 40-43. The source/drain regions 51, 52, 55, 56, 59, 60, 63 and 64 may be referred to as first, second, third, fourth, fifth, sixth, seventh and eighth source/drain regions respectively.

The transistors 26a, 28a, 26b and 28b include the body regions 64, 66, 68 and 70, respectively; with such being connected to suitable voltage through the body connection lines 200 and 202. The body connection lines 200 and 202 are analogous to the body connection lines 65, 67, 69 and 71 described above with reference to FIG. 3, and may comprise the same compositions as described above relative to the body connection lines 65, 67, 69 and 71. However, the adjacent memory cells 24a and 24b share the body connection lines 200 and 202, rather than having the four different body connection lines 65, 67, 69 and 71 shown in the embodiment of FIG. 3. The body connection lines 200 and 202 extend along the plane of the page relative to the cross-sectional view of FIG. 13. Approximate boundaries of the body connection lines with channel regions 50, 54, 58 and 62 of the transistors 26a, 28a, 26b and 28b are diagrammatically illustrated with dashed lines 61. Approximate boundaries of the body connection lines with the source/drain regions 52, 56, 60 and 64 may be considered to be along interfaces with the spacing regions 79.

The body connection lines 200 and 202 may be referred to as first and second body connection lines, respectively. The first body connection line 202 couples the body regions 64 and 68 to a first reference voltage 72, and the second body connection line 202 couples the body regions 66 and 70 to a second reference voltage 73. The first and second reference voltages 72 and 73 may be the same as one another in some embodiments, and may be different from one another in other embodiments.

A first wordline 38 extends along the first and second transistors 26a and 28a; and a second wordline 38a extends along the third and fourth transistors 26b and 28b.

Figure 14:
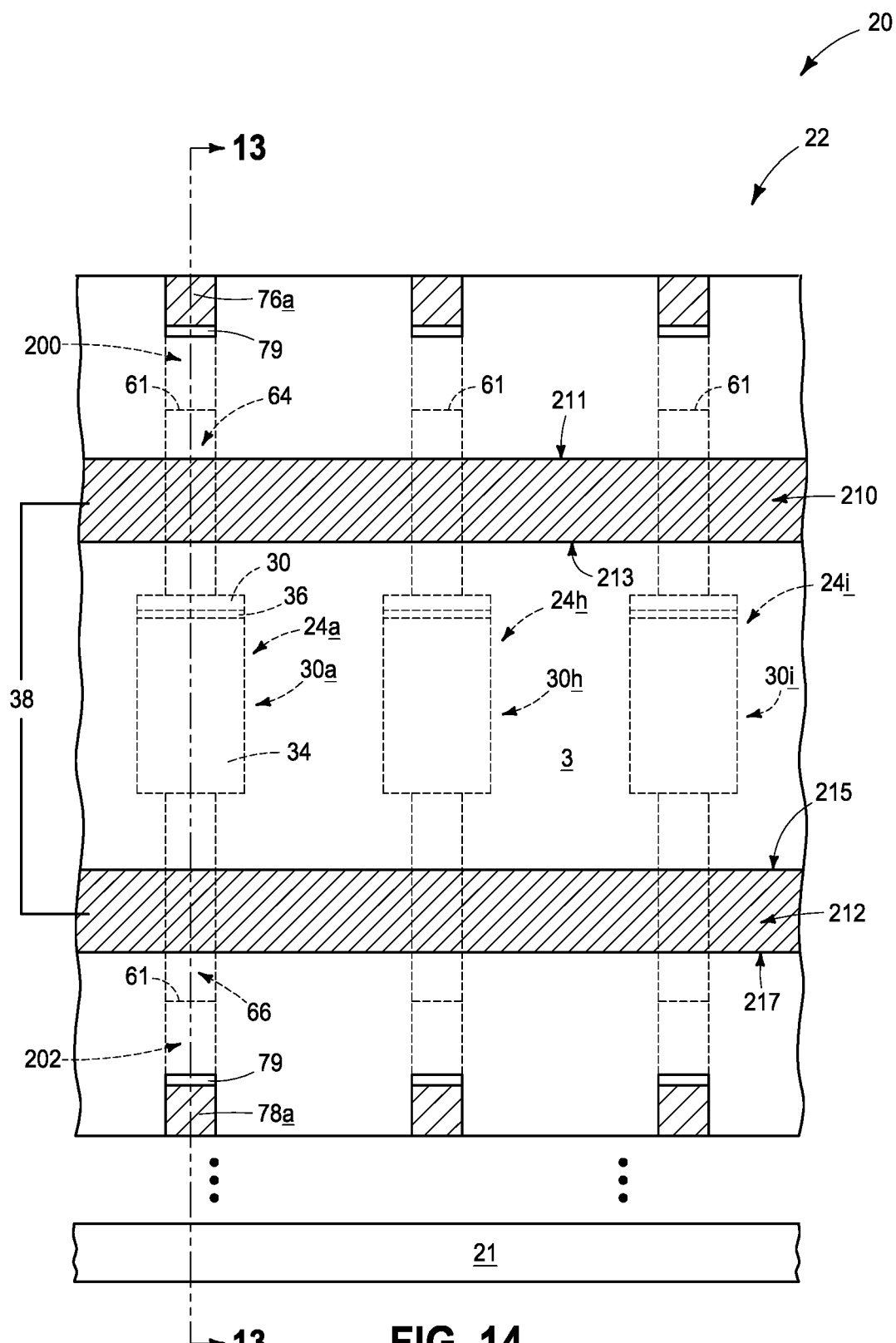
FIGS. 14 and 15 are diagrammatic cross-sectional side views of the memory array of FIG. 13 shown along a cross-section orthogonal to that of FIG. 13.

FIG. 14 shows a cross-section of memory array 22 along a plane orthogonal to the plane of FIG. 13, and along the line 14/15-14/15 of FIG. 13. The plane of FIG. 14 is along the wordline 38. The memory cell 24a is shown in FIG. 14, but is in dashed-line view as it is behind the plane of FIG. 14. Other memory cells 24h and 24i are along a row comprising wordline 38 and are substantially identical to the memory cell 24a; and, like the memory cell 24a, are behind the plane of FIG. 14.

Figure 15:
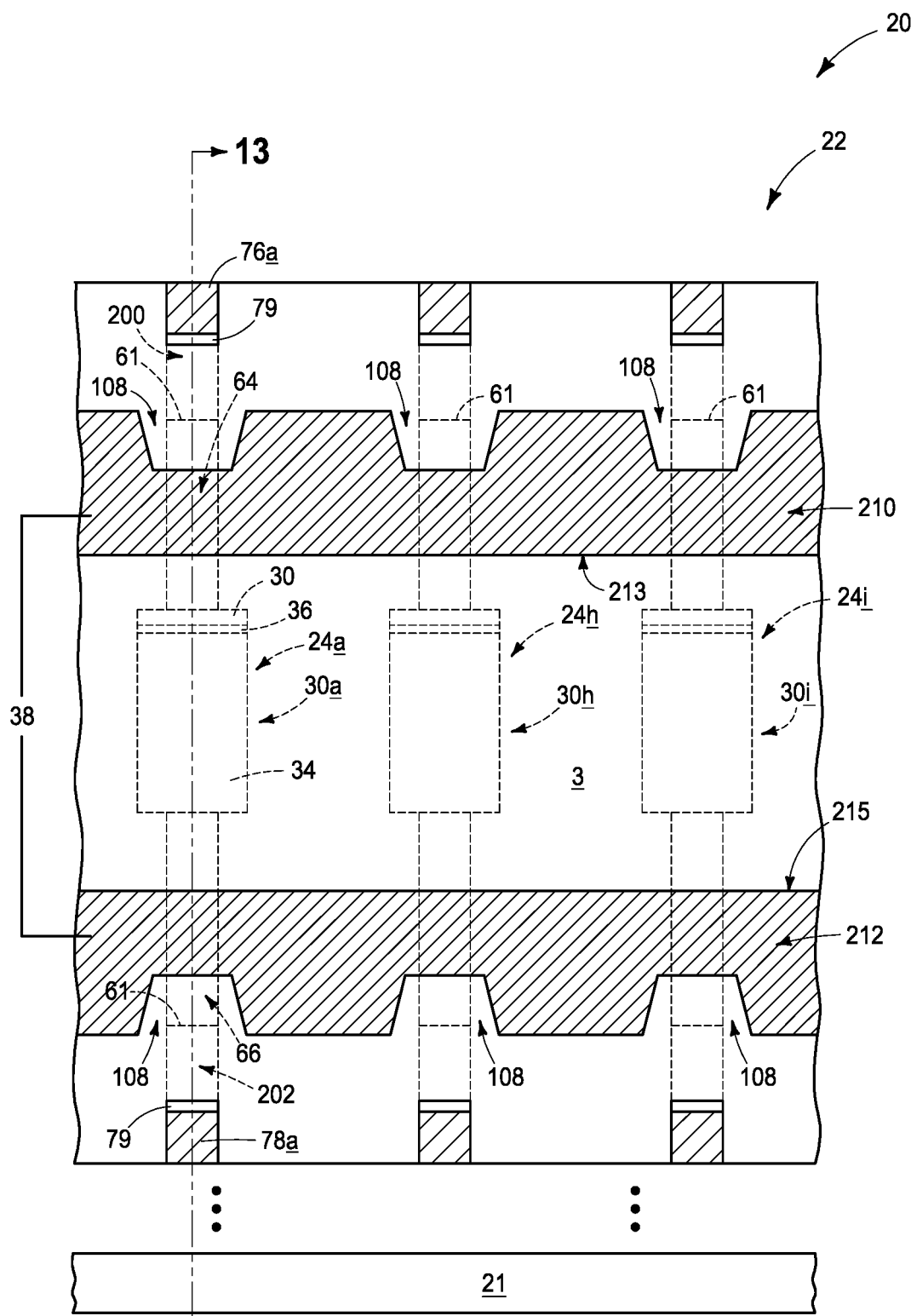

The wordline 38 is shown to have an upper region 210 and a lower region 212. The upper region 210 has a planar upper surface 211, and a planar lower surface 213; and the lower region 212 has a planar upper surface 215 and a planar lower surface 217. Accordingly, the upper and lower portions 210 and 212 of wordline 38 lack saddle regions (i.e., analogous to the regions 108 of FIG. 7) to vertically overlap regions of the body connection lines 200 and 202. The embodiment of FIG. 14 may be acceptable in some applications. In other applications, saddle regions analogous to the regions 108 of FIG. 7 may be desired. FIG. 15 shows an embodiment analogous to that of FIG. 14, but in which the upper and lower regions 210 and 212 comprise saddle regions 108 (analogous to those of FIG. 7) so that portions of the of the body connection lines 200 and 202 are vertically overlapped by the wordline 38 to achieve advantages of the types described above with reference to FIG. 7.

Figure 16:
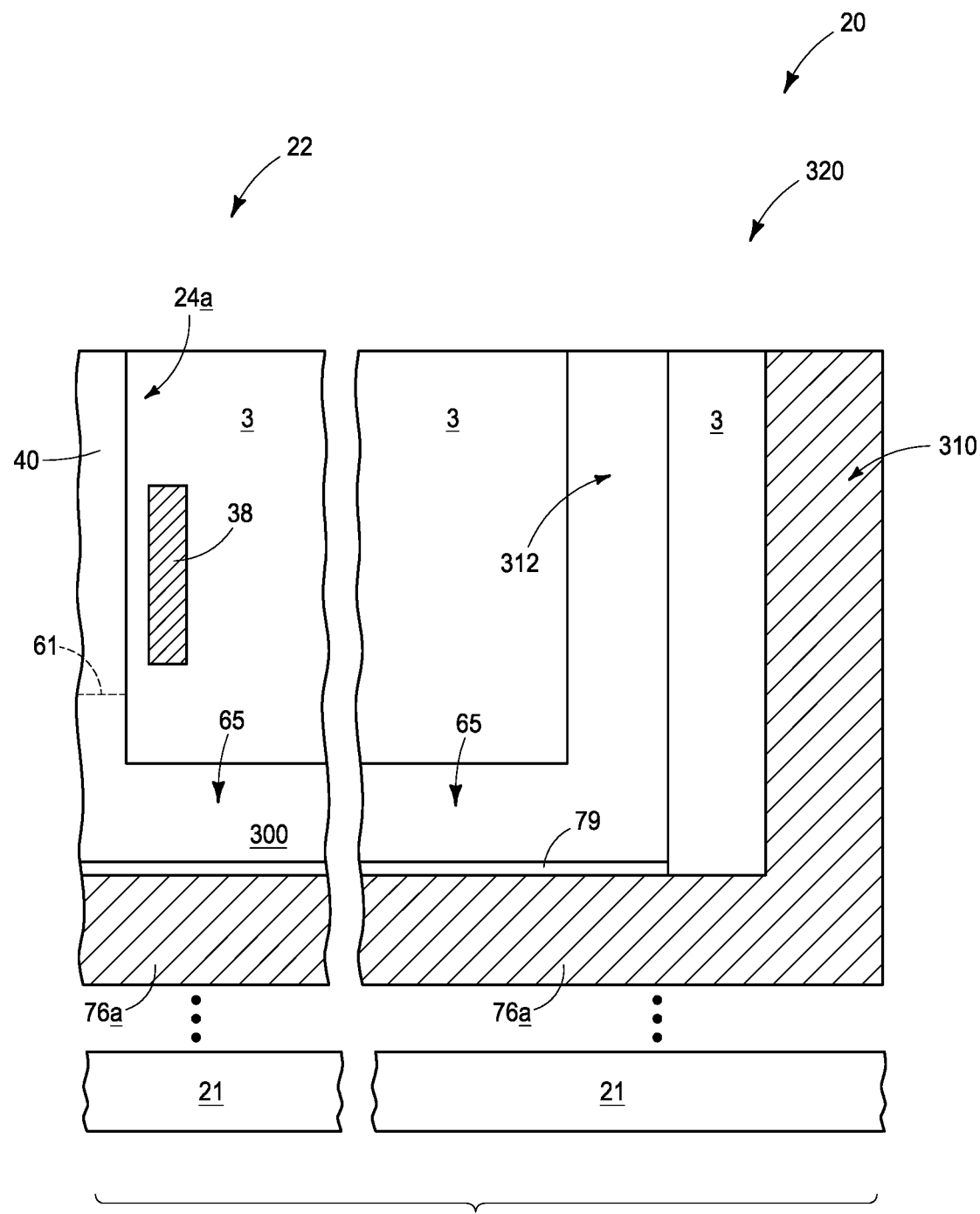
FIG. 16 is a diagrammatic cross-sectional side view of a region of an example apparatus having an example memory array, and an example region peripheral to the memory for making electrical connections to lines extending across the memory array.

In some embodiments, a body line connection may be routed to a second interconnect and a comparative bitline may be routed to a first interconnect, and the second interconnect may be nested within the first interconnect. Such is illustrated in FIG. 16. Specifically, a portion of a memory cell 24a is illustrated, with such portion including a wordline 38, and a semiconductor material 300. The pillar 40 and body connection line 65 are patterned from the semiconductor material 300. The body connection line 65 is spaced from an underlying comparative bitline 76a by a spacing region 79. The comparative bitline 76a extends to a first interconnect 310, and the body connection line 65 extends to a second interconnect 312. The memory cell 24a may be within a memory array region 22 of the apparatus (i.e., assembly) 20; and the first and second interconnects 310 and 312 may be within a region 320 peripheral to the memory array region. In the illustrated embodiment, the second interconnect 312 is nested within the first interconnect 310 so that the semiconductor material 300 does not cross material of comparative bitline 76a in extending to the interconnect 312.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections (unless indicated otherwise) in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an apparatus having a memory cell with two transistors and one capacitor. The two transistors are a first transistor and a second transistor. The capacitor has a first node coupled with a source/drain region of the first transistor, and has a second node coupled with a source/drain region of the second transistor. The memory cell has a first body region vertically offset from the source/drain region of the first transistor, and has a second body region vertically offset from the source/drain region of the second transistor. A first body connection line couples the first body region of the memory cell to a first reference voltage. A second body connection line couples the second body region of the memory cell to a second reference voltage.

Some embodiments include an apparatus which includes a first memory cell and a second memory cell. The first memory cell has two transistors and one capacitor. The two transistors of the first memory cell are a first transistor and a second transistor. The first transistor has first and second source/drain regions, and the second transistor has third and fourth source/drain regions. The capacitor of the first memory cell is a first capacitor. The first capacitor has a first node coupled with the first source/drain region of the first transistor, and has a second node coupled with the third source/drain region of the second transistor. The first memory cell has a first body region between the first and second source/drain regions of the first transistor, and has a second body region between the third and fourth source/drain regions of the second transistor. The second memory cell has two transistors and one capacitor. The two transistors of the second memory cell are a third transistor and a fourth transistor. The third transistor has fifth and sixth source/drain regions, and the fourth transistor has seventh and eighth source/drain regions. The capacitor of the second memory cell is a second capacitor. The second capacitor has a third node coupled with the fifth source/drain region of the third transistor, and has a fourth node coupled with the seventh source/drain region of the fourth transistor. The second memory cell has a third body region between the fifth and sixth source/drain regions of the third transistor, and has a fourth body region between the seventh and eighth source/drain regions of the fourth transistor. A first body connection line couples the first body region of the first memory cell and the third body region of the second memory cell to a first reference voltage. A second body connection line couples the second body region of the first memory cell and the fourth body region of the second memory cell to a second reference voltage.

Some embodiments an apparatus which includes a first memory cell and a second memory cell. The first memory cell has two transistors and one capacitor. The two transistors of the first memory cell are a first transistor and a second transistor. The first transistor has first and second source/drain regions, and the second transistor has third and fourth source/drain regions. The capacitor of the first memory cell is a first capacitor. The first capacitor has a first node coupled with the first source/drain region of the first transistor, and has a second node coupled with the third source/drain region of the second transistor. The first memory cell has a first body region between the first and second source/drain regions of the first transistor, and has a second body region between the third and fourth source/drain regions of the second transistor. The second memory cell has two transistors and one capacitor. The two transistors of the second memory cell are a third transistor and a fourth transistor. The third transistor has fifth and sixth source/drain regions, and the fourth transistor has seventh and eighth source/drain regions. The capacitor of the second memory cell is a second capacitor. The second capacitor has a third node coupled with the fifth source/drain region of the third transistor, and has a fourth node coupled with the seventh source/drain region of the fourth transistor. The second memory cell has a third body region between the fifth and sixth source/drain regions of the third transistor, and has a fourth body region between the seventh and eighth source/drain regions of the fourth transistor. The second memory cell shares first and second comparative bitlines with the first memory cell. A first body connection line couples the first body region of the first memory cell to a first reference voltage. A second body connection line couples the second body region of the first memory cell to a second reference voltage. A third body connection line couples the third body region of the second memory cell to a third reference voltage. A fourth body connection line couples the fourth body region of the second memory cell to a fourth reference voltage.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An apparatus, comprising:
a memory cell having two transistors and one capacitor; the two transistors being a first transistor and a second transistor; the capacitor having a first node coupled with a source/drain region of the first transistor, and having a second node coupled with a source/drain region of the second transistor; the memory cell having a first body region vertically offset from the source/drain region of the first transistor, and having a second body region vertically offset from the source/drain region of the second transistor;
a first body connection line coupling the first body region of the memory cell to a first conductive region having a first reference voltage; the first body connection line comprising a first composition; and
a second body connection line coupling the second body region of the memory cell to a second conductive region having a second reference voltage; the first body connection line comprising a second composition; the first and second compositions comprising doped semiconductor material.
2. The apparatus of claim 1, wherein the memory cell is vertically offset from an underlying supporting substrate; and wherein the first and second transistors are vertically stacked one atop another, with the capacitor being between the vertically-stacked first and second transistors.
3. The apparatus of claim 1, wherein the memory cell is vertically offset from an underlying supporting substrate; and wherein the first and second transistors are laterally offset relative to one another, with the capacitor being vertically-offset relative to the first and second transistors.
4. The apparatus of claim 1, wherein the first and second conductive regions are comprised by a common conductive structure.
5. The apparatus of claim 1, wherein the first and second reference voltages are the same as one another.
6. The apparatus of claim 1, including a wordline coupled with the first and second transistors of the memory cell; the wordline including first and second gate regions of the first and second transistors, respectively; the first and second gate regions being proximate the first and second body regions; a segment of the wordline being between the first and second gate regions; the memory cell and wordline being over an underlying supporting substrate; the capacitor being vertically offset relative to the wordline.
7. The apparatus of claim 6, wherein:
the first gate region of the wordline has a first upper surface and a first lower surface;
the second gate region of the wordline has a second upper surface and a second lower surface;
the segment of the wordline has a third upper surface between the first and second upper surfaces of the first and second gate regions;
the segment of the wordline has a third lower surface between the first and second lower surfaces of the first and second gate regions;
the third upper surface is substantially planar with the first and second upper surfaces; and
the third lower surface is substantially planar with the first and second lower surfaces.
8. The apparatus of claim 6, wherein:
the capacitor is above the wordline;
the first gate region of the wordline has a first upper surface and a first lower surface;
the second gate region of the wordline has a second upper surface and a second lower surface;
the segment of the wordline has a third upper surface between the first and second upper surfaces of the first and second gate regions;
the segment of the wordline has a third lower surface between the first and second lower surfaces of the first and second gate regions;
the third upper surface is substantially planar with the first and second upper surfaces; and
the third lower surface is vertically offset relative to the first and second lower surfaces.
9. The apparatus of claim 6, wherein:
the capacitor is below the wordline;
the first gate region of the wordline has a first upper surface and a first lower surface;
the second gate region of the wordline has a second upper surface and a second lower surface;
the segment of the wordline has a third upper surface between the first and second upper surfaces of the first and second gate regions;
the segment of said same wordline has a third lower surface between the first and second lower surfaces of the first and second gate regions;
the third upper surface is vertically offset relative to the first and second upper surfaces; and
the third lower surface is substantially planar with the first and second lower surfaces.
10. An apparatus, comprising:
a first memory cell having two transistors and one capacitor; the two transistors of the first memory cell being a first transistor and a second transistor; the first transistor having first and second source/drain regions, and the second transistor having third and fourth source/drain regions; the first and second transistors being vertically-oriented such that the first and second source/drain regions are vertically offset relative to one another, and the third and fourth source/drain regions are vertically offset relative to one another; the capacitor of the first memory cell being a first capacitor; the first capacitor having a first node coupled with the first source/drain region of the first transistor, and having a second node coupled with the third source/drain region of the second transistor; the first and second nodes both comprising metal; the first memory cell having a first body region between the first and second source/drain regions of the first transistor, and having a second body region between the third and fourth source/drain regions of the second transistor;
a second memory cell having two transistors and one capacitor; the two transistors of the second memory cell being a third transistor and a fourth transistor; the third transistor having fifth and sixth source/drain regions, and the fourth transistor having seventh and eighth source/drain regions; the third and fourth transistors being vertically-oriented such that the fifth and sixth source/drain regions are vertically offset relative to one another, and the seventh and eighth source/drain regions are vertically offset relative to one another; the capacitor of the second memory cell being a second capacitor; the second capacitor having a third node coupled with the fifth source/drain region of the third transistor, and having a fourth node coupled with the seventh source/drain region of the fourth transistor; the second memory cell having a third body region between the fifth and sixth source/drain regions of the third transistor, and having a fourth body region between the seventh and eighth source/drain regions of the fourth transistor;

a first body connection line coupling the first body region of the first memory cell and the third body region of the second memory cell to a first reference voltage; and a second body connection line coupling the second body region of the first memory cell and the fourth body region of the second memory cell to a second reference voltage.

11. The apparatus of claim 10, wherein the first and second reference voltages are the same as one another.

12. The apparatus of claim 10, wherein the first and second memory cells share a digit line; and wherein the digit line includes:

a first comparative bitline coupled to the second source/drain region of the first transistor and the sixth source/drain region of the third transistor; and a second comparative bitline coupled to the fourth source/drain region of the second transistor and the eighth source/drain region of the fourth transistor.

13. The apparatus of claim 12, wherein:

a first wordline is coupled with the first and second transistors of the first memory cell; and a second wordline is coupled with the third and fourth transistors of the second memory cell.

14. The apparatus of claim 12, wherein the first and second body connection lines are doped to a first conductivity type, and are spaced from the first and second comparative bitlines by spacing regions comprising semiconductor material doped to a second conductivity type different from the first conductivity type; said spacing regions comprising the second, fourth, sixth and eighth source/drain regions.

15. An apparatus, comprising:

a first memory cell having two transistors and one capacitor; the two transistors of the first memory cell being a first transistor and a second transistor; the first transistor having first and second source/drain regions, and the second transistor having third and fourth source/drain regions; the first and second transistors being vertically-oriented such that the first and second source/drain regions are vertically offset relative to one another, and the third and fourth source/drain regions are vertically offset relative to one another; the capacitor of the first memory cell being a first capacitor; the first capacitor having a first node coupled with the first source/drain region of the first transistor, and having a second node coupled with the third source/drain region of the second transistor; the first memory cell having a first body region between the first and second source/drain regions of the first transistor, and having a second body region between the third and fourth source/drain regions of the second transistor;

a second memory cell having two transistors and one capacitor; the two transistors of the second memory cell being a third transistor and a fourth transistor; the third transistor having fifth and sixth source/drain regions, and the fourth transistor having seventh and eighth source/drain regions; the third and fourth transistors being vertically-oriented such that the fifth and sixth source/drain regions are vertically offset relative to one another, and the seventh and eighth source/drain regions are vertically offset relative to one another; the capacitor of the second memory cell being a second capacitor; the second capacitor having a third node coupled with the fifth source/drain region of the third transistor, and having a fourth node coupled with the seventh source/drain region of the fourth transistor; the second memory cell having a third body region between the fifth and sixth source/drain regions of the third transistor, and having a fourth body region between the seventh and eighth source/drain regions of the fourth transistor;

the second memory cell sharing first and second comparative bitlines with the first memory cell; the first and second comparative bitlines both comprising metal;

a first body connection line coupling the first body region of the first memory cell to a first reference voltage;

a second body connection line coupling the second body region of the first memory cell to a second reference voltage;

a third body connection line coupling the third body region of the second memory cell to a third reference voltage; and a fourth body connection line coupling the fourth body region of the second memory cell to a fourth reference voltage.

16. The apparatus of claim 15, wherein the first and third body connection lines are substantially parallel to the first comparative bitline; wherein the second and fourth body connection lines are substantially parallel to the second comparative bitline; and wherein the first, second, third and fourth body connection lines comprise conductively-doped semiconductor material.

17. The apparatus of claim 15, wherein the first and second comparative bitlines comprise metal.

18. The apparatus of claim 17, wherein the first, second, third and fourth body connection lines are doped to a first conductivity type, and are spaced from the first and second comparative bitlines by spacing regions comprising semiconductor material doped to a second conductivity type different from the first conductivity type; said spacing regions comprising the second, fourth, sixth and eighth source/drain regions.

19. The apparatus of claim 15, wherein an axis through the first and second comparative bitlines defines a mirror plane; and wherein the second memory cell is on an opposing side of the mirror plane from the first memory cell and is substantially a mirror image of the first memory cell across the mirror plane.

* * * * *